United States Patent
Toyoda

(10) Patent No.: US 9,488,162 B2
(45) Date of Patent: Nov. 8, 2016

(54) ELECTRONIC DEVICE

(71) Applicant: FUJITSU LIMITED, Kawasaki-shi, Kanagawa (JP)

(72) Inventor: Osamu Toyoda, Akashi (JP)

(73) Assignee: FUJITSU LIMITED, Kawasaki (JP)

( * ) Notice: Subject to any disclaimer, the term of this patent is extended or adjusted under 35 U.S.C. 154(b) by 571 days.

(21) Appl. No.: 14/022,604

(22) Filed: Sep. 10, 2013

(65) Prior Publication Data

US 2014/0009035 A1 Jan. 9, 2014

Related U.S. Application Data

(63) Continuation of application No. PCT/JP2011/057848, filed on Mar. 29, 2011.

(51) Int. Cl.
*H01L 41/09* (2006.01)
*F03G 7/06* (2006.01)
*H01G 5/16* (2006.01)
*B81B 3/00* (2006.01)
*C25D 7/00* (2006.01)
*H02N 1/00* (2006.01)
*H01L 41/318* (2013.01)
(Continued)

(52) U.S. Cl.
CPC .............. *F03G 7/065* (2013.01); *B81B 3/0072* (2013.01); *B81B 3/0086* (2013.01); *C25D 7/00* (2013.01); *H01G 5/16* (2013.01); *H01L 41/0926* (2013.01); *H01L 41/0933* (2013.01); *H01L 41/0973* (2013.01); *H01L 41/318* (2013.01); *H02N 1/006* (2013.01); *B81B 2201/016* (2013.01); *B81B 2201/0221* (2013.01); *H01H 59/0009* (2013.01); *H01H 2001/0084* (2013.01)

(58) Field of Classification Search
CPC ....... H02N 1/006; H01G 5/16; B81B 3/0086
USPC .................................................. 257/414–416
See application file for complete search history.

(56) References Cited

U.S. PATENT DOCUMENTS 5,870,007 A * 2/1999 Carr .......................... F03G 7/06
                                                           333/197
6,813,133 B2 * 11/2004 Yasuoka ............ H01H 59/0009
                                                           335/78
7,372,348 B2    5/2008 Xu
(Continued)

FOREIGN PATENT DOCUMENTS

CN        1898814 A      1/2007
JP        H1-179286      7/1989
(Continued)

OTHER PUBLICATIONS

Office Action of corresponding Chinese Patent Application No. 201180069633.2 dated Oct. 9, 2015; full translation of the Office Action.
(Continued)

*Primary Examiner* — J. San Martin
(74) *Attorney, Agent, or Firm* — Kratz, Quintos & Hanson, LLP

(57) ABSTRACT

An electronic device includes a substrate, an electrode formed on the substrate, and a movable portion provided above the electrode, the movable portion being elastically deformable, in which the movable potion includes a shape memory alloy film.

14 Claims, 41 Drawing Sheets

(51) Int. Cl.
    *H01H 59/00* (2006.01)
    *H01H 1/00* (2006.01)

(56) References Cited

U.S. PATENT DOCUMENTS

| | | | | |
|---|---|---|---|---|
| 7,550,810 | B2* | 6/2009 | Mignard | B81B 3/0078 |
| | | | | 257/415 |
| 7,687,108 | B2 | 3/2010 | Xu | |
| 8,378,556 | B2* | 2/2013 | Takahashi | B81B 3/0072 |
| | | | | 257/414 |
| 2004/0022044 | A1 | 2/2004 | Yasuoka et al. | |
| 2004/0075364 | A1* | 4/2004 | Mehta | H01G 5/18 |
| | | | | 310/324 |
| 2005/0146401 | A1 | 7/2005 | Tilmans et al. | |
| 2005/0242687 | A1* | 11/2005 | Kawakubo | B81B 3/0021 |
| | | | | 310/324 |
| 2006/0067840 | A1* | 3/2006 | Kawakubo | H01G 5/16 |
| | | | | 417/413.2 |
| 2006/0098059 | A1* | 5/2006 | Ohguro | B81B 3/0018 |
| | | | | 347/72 |
| 2006/0119227 | A1* | 6/2006 | Ikehashi | H01G 5/18 |
| | | | | 310/348 |
| 2006/0157808 | A1* | 7/2006 | Matsuo | B81C 1/00095 |
| | | | | 257/415 |
| 2006/0186492 | A1* | 8/2006 | Boettiger | H01L 27/14601 |
| | | | | 257/414 |
| 2006/0238956 | A1* | 10/2006 | Casset | H01G 5/18 |
| | | | | 361/277 |
| 2007/0108875 | A1 | 5/2007 | Klee et al. | |
| 2008/0238257 | A1* | 10/2008 | Kawakubo | H01G 5/18 |
| | | | | 310/328 |

FOREIGN PATENT DOCUMENTS

| | | |
|---|---|---|
| JP | H2-43351 | 2/1990 |
| JP | H5-190617 | 7/1993 |
| JP | H7-90436 | 4/1995 |
| JP | 2002-39053 A1 | 2/2002 |
| JP | 2002-103057 A1 | 4/2002 |
| JP | 2002-144297 A1 | 5/2002 |
| JP | 2002-170470 A1 | 6/2002 |
| JP | 2006-55991 A1 | 3/2006 |
| JP | 2007-125626 A1 | 5/2007 |
| WO | WO 02/061781 A1 | 8/2002 |

OTHER PUBLICATIONS

International Search Report for International Application No. PCT/JP2011/057848 dated Jul. 5, 2011.

Office Action of corresponding Chinese Patent Application No. 201180069633.2 dated Apr. 20, 2016, with full translation.

* cited by examiner

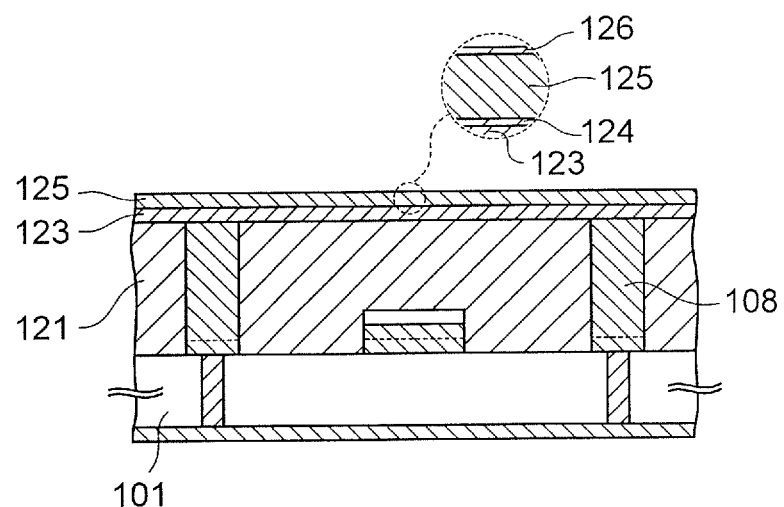
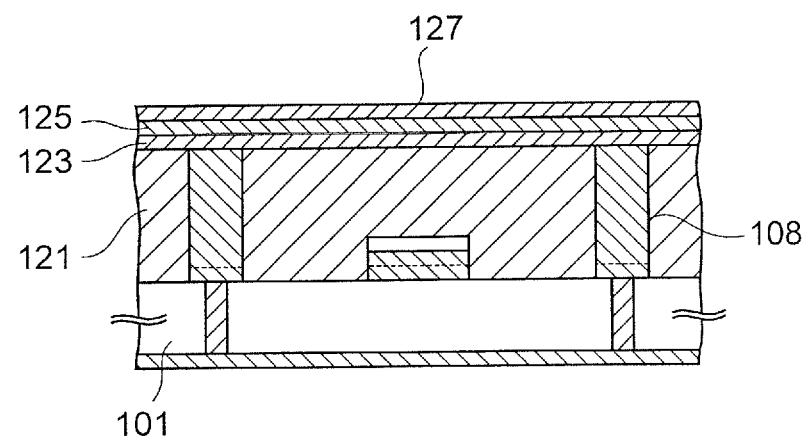

ELECTRONIC DEVICE

CROSS-REFERENCE TO RELATED APPLICATION

This application is a continuation of International Patent Application No. PCT/JP2011/057848 filed Mar. 29, 2011 and designated the U.S., the entire contents of which are incorporated herein by reference.

FIELD

The embodiments discussed herein are related to an electronic device and a method of manufacturing an electronic device.

BACKGROUND

To advance miniaturization and integration of electronic devices to be mounted on electronic equipment such as mobile telephones, the MEMS (Micro Electro Mechanical Systems) technology is going to be adopted. The electronic devices manufactured by the MEMS technology include, for example, switch elements and variable capacitors.

In these electronic devices, a metal thin film is attracted with electrostatic force or the like, so that the metal thin film is caused to have a function as a movable portion. For example, in a switch element, a metal thin film is used as a cantilever. The cantilever to be bent with electrostatic force is brought into contact with a terminal to perform switching. In addition, in a variable capacitor, a metal thin film is used as a movable electrode for a capacitor and a distance between electrodes is caused to be variable with application of electrostatic force.

A bending amount of the movable portion may be controlled by a magnitude of the electrostatic force to be applied. Then, in the electronic device including such a movable portion, it is preferable that even when the ambient temperature is changed, the magnitude of the electrostatic force to be applied do not change and the same electric characteristics be always obtained.

Patent document 1: Japanese Laid-open Patent Publication No. 05-190617
Patent document 2: Japanese Laid-open Patent Publication No. 2006-55991
Patent document 3: Japanese Laid-open Patent Publication No. 01-179286

SUMMARY

According to one aspect of the following disclosure, there is provided an electronic device including a substrate, a first electrode formed on the substrate, and a movable portion provided above the first electrode, the movable portion being elastically deformable, in which the movable portion includes a shape memory alloy film.

Also, according to another aspect of the disclosure, there is provided a method of manufacturing an electronic device, the method including: forming a first electrode on a substrate; forming a sacrificial film with a flat upper surface on the substrate and the first electrode; forming a movable portion including a shape memory alloy film on the upper surface of the sacrificial film; performing heat treatment on the movable portion on the flat upper surface to cause the shape memory alloy film to memorize a flat shape; and removing the sacrificial film after the heat treatment to cause the movable portion to be elastically deformable so as to be bent with electrostatic force generated from the first electrode.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 21A to 21E are cross-sectional views of the variable capacitor in the course of manufacturing thereof according to the eighth embodiment;

DESCRIPTION OF EMBODIMENTS

Studies carried out by the inventors of the present application are described before the present embodiment is described.

Various movable portions are formed in an electronic device manufactured by the MEMS technology. The electronic device with movable portions includes a variable capacitor and a switch element.

Among them, a variable capacitor is firstly described.

Figure 1A:
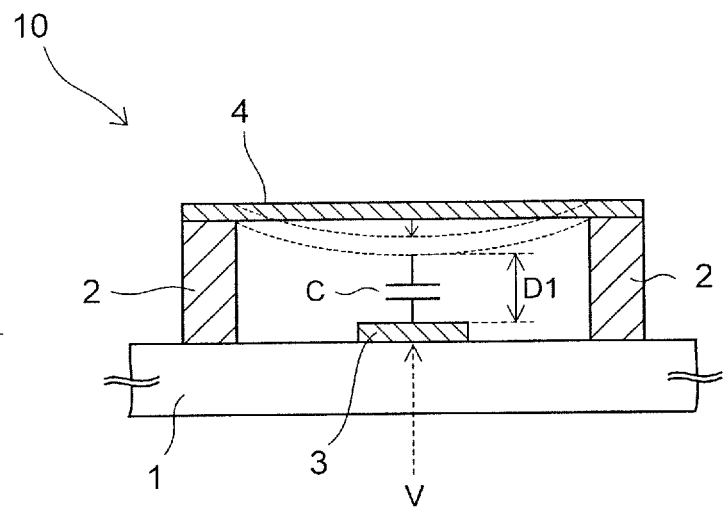
FIGS. 1A and 1B are cross-sectional views of a variable capacitor used for a study.

FIG. 1A is a cross-sectional view of a variable capacitor.

This variable capacitor 10 includes an insulating substrate 1, pillars 2, an electrode 3, and a movable upper electrode 4.

The insulating substrate 1 is, for example, a glass substrate, and the electrode 3 is formed by patterning a gold film formed thereon.

In addition, the pillars 2 are made of a conductive material, such as gold, maintained at the ground potential, and the movable upper electrode 4 provided as a movable portion is fixed on the upper surface of each pillar 2. The movable upper electrode 4 is made of, for example, a single-layer metal film such as a gold film.

Note that an adhesion layer with a thickness of approximately 50 nm to 200 nm may be formed on the lower surface of the movable upper electrode 4.

In such a variable capacitor 10, a capacitance C is formed between the electrode 3 and the movable upper electrode 4. Then, to cause the size of the capacitance C to be variable, the potential of the pillars 2 and the movable upper electrode 4 is maintained at the ground potential, and a positive potential V is applied to the electrode 3 to generate an electrostatic field around the electrode 3.

Accordingly, as illustrated by the dotted line in FIG. 1A, the movable upper electrode 4 with a potential lower than that of the electrode 3 is attracted and bent to the electrode 3 side by the electrostatic force. Thus, a distance D1 between the movable upper electrode 4 and the electrode 3 is shortened and the capacitance C may be increased as compared with the capacitance C before the application of the positive potential V.

The size of the capacitance C may be controlled by changing the distance D1 with fine adjustment of the magnitude of the positive potential V.

Then, it is ideally preferable that a capacitance C with the same size is always obtained when the positive potential V with the same magnitude is applied to the electrode 3 even in a case where an ambient temperature of the variable capacitor 10 changes. For example, even when the temperature changes, if the movable upper electrode 4 is always flat when the positive potential V is not applied, the positive potential V which is used for generating a predetermined bending amount from the flat state is also to be the same magnitude. Thus, the capacitor C may be finely adjusted regardless of the environment.

Figure 1B:
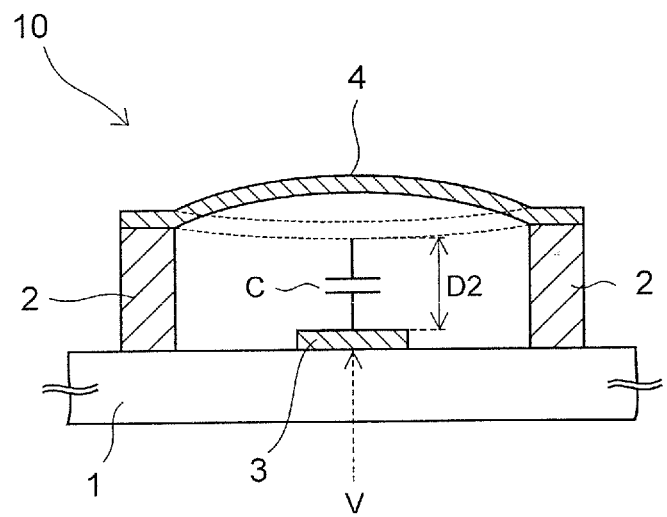

However, according to the study carried out by the inventors of the present application, as illustrated in FIG. 1B, it becomes clear that the movable upper electrode 4 is bent in a direction away from the insulating substrate 1 when the ambient temperature of the variable capacitor 10 increases. This is thought to be due to thermal expansion of the movable upper electrode 4 as the temperature increases.

When the movable upper electrode 4 is bent upwardly with the heat as described above, the magnitude of the positive potential V which is used for attracting the movable upper electrode 4 to the insulating substrate 1 side becomes larger as compared with the case where the movable upper electrode 4 is flat as illustrated in FIG. 1A.

For this reason, even though the positive potential V same as that of the case in FIG. 1A is applied to the electrode 3, a distance D2 between the movable upper electrode 4 and the electrode 3 becomes wider than the distance D1 in FIG. 1A. Thus, the fine adjustment of the size of the capacitance C becomes difficult to be made with the positive potential V.

In addition, when the movable upper electrode 4 is bent exceeding the plastic limit of a material due to the thermal expansion, this prevents the movable upper electrode 4 from returning to the original shape. This causes a problem such that the variable capacitor 10 does not operate.

A problem similar to the foregoing is caused in a switch element.

Figure 2A:
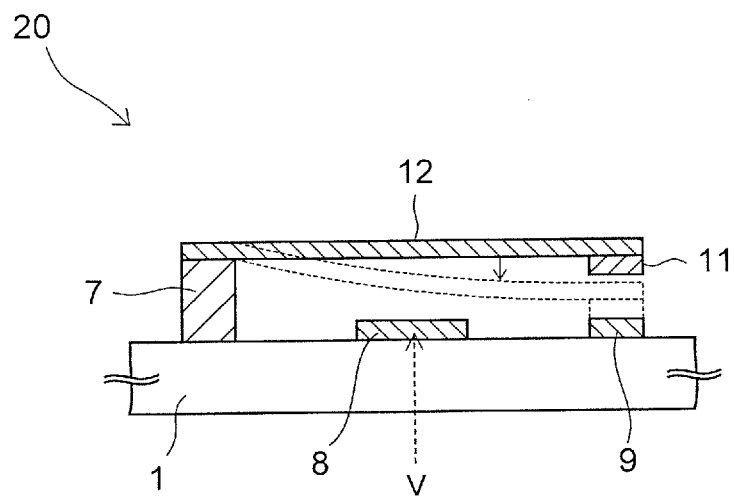
FIGS. 2A and 2B are cross-sectional views of a switch element used for a study.

FIG. 2A is a cross-sectional view of a switch element which is manufactured by the MEMS technology.

This switch element 20 includes an insulating substrate 1, a pillar 7, an electrode 8, a conductor pattern 9, a contact 11, and a cantilever 12.

Among them, the electrode 8 and the conductor pattern 9 may be obtained by patterning a gold film formed on the insulating substrate 1.

Also, the pillar 7 is made of a conductive material such as gold which is maintained at the ground potential, and the cantilever 12 provided as a movable portion is fixed on the upper surface thereof.

The cantilever 12 has one end which is a vertically movable free end, and the conductive contact 11 is provided in the free end.

In such a switch element 20, a positive potential V is applied to the electrode 8 to generate an electrostatic filed around the electrode 8, so that the cantilever 12 is attracted to the insulating substrate 1 side with the electrostatic force. Accordingly, the terminal 11 comes into contact with the conductor pattern 9 as illustrated by the dotted line to perform switching between the terminal 11 and the conductive pattern 9.

To increase the reliability of the switching, it is preferable that the contact 11 comes into contact with the conductor pattern 9 when the positive potential V is applied.

Figure 2B:
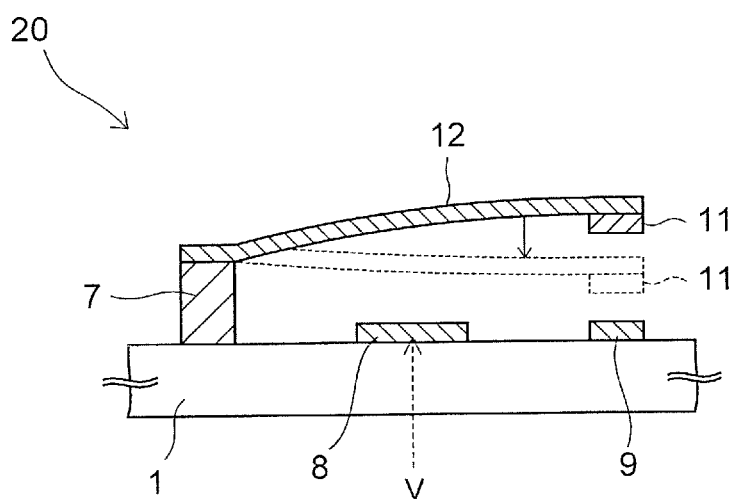

However, as illustrated in FIG. 2B, when the temperature around the switch element 20 increases, the cantilever 12 thermally expands, which causes that the cantilever 12 is bent in a direction away from the insulating substrate 1. In this case, a gap is caused between the conductor pattern 9 and the contact 11 even when the positive potential V is applied to the electrode 8. This increases a risk such that the switching is not performed therebetween.

Furthermore, if the cantilever 12 is bent exceeding the plastic limit of a material with the thermal expansion, the cantilever 12 does not return to the original shape. Thus, there is a problem such that the switch element 20 is not turned on.

Based on the results of the studies, the inventors of the present application have arrived at embodiments to be described below.

First Embodiment

In the present embodiment, a variable capacitor as an electronic device is manufactured as follows.

Figure 3:
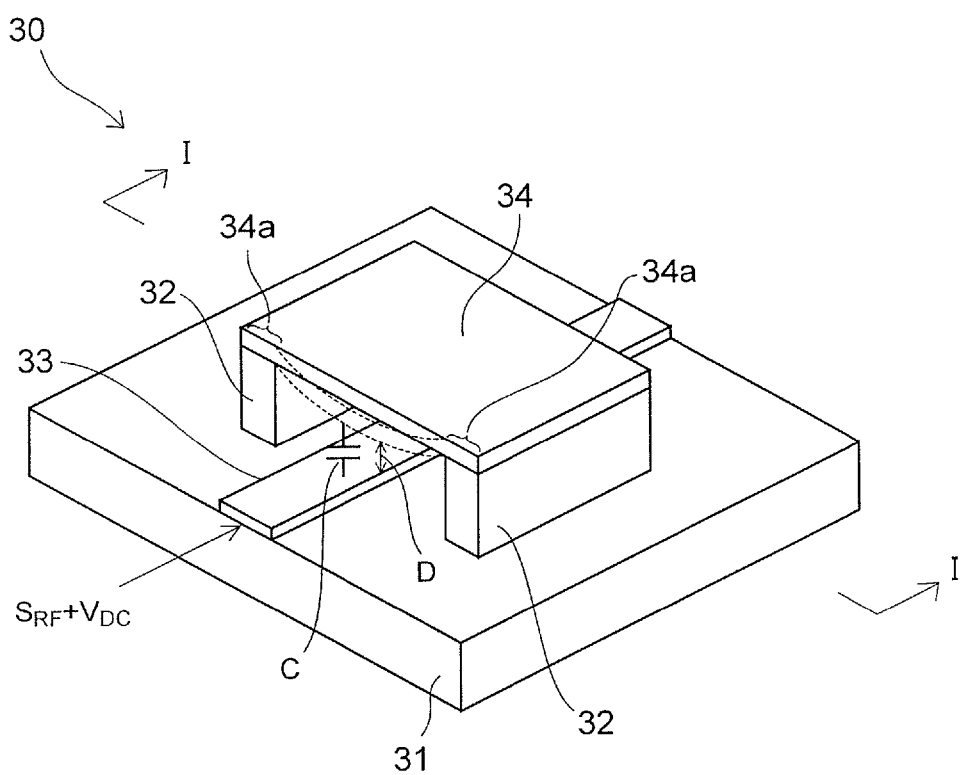
FIG. 3 is a perspective view of a variable capacitor according to a first embodiment.

FIG. 3 is a perspective view of a variable capacitor according to the present embodiment.

A variable capacitor 30 includes an insulating substrate 31, pillars 32, an electrode 33, and a movable upper electrode 34.

Among them, as a material for the insulating substrate 31, any of high-resistivity silicon, glass, and ceramic whose impurity concentration is low may be used.

Also, the electrode 33 is provided as a line for, for example, a high-frequency signal $S_{RF}$, and the pillars 32 are provided on the both sides of the electrode 33 on the insulating substrate 31. Note that as the line for the high-frequency signal $S_{RF}$, there are CPW (coplanar waveguide) and a micro-strip line which works with an unillustrated ground pattern provided on the rear surface of the insulating substrate 31.

The pillars 32 are formed of a gold plate or the like, which is described later. Then, one portion 34a of the movable upper electrode 34 provided as a movable portion is fixed on the upper surface of each pillar 32 in a vertically elastically deformable state, so that the movable upper electrode 34 is mechanically connected with the insulating substrate 31 through the pillars 32.

In such a variable capacitor 30, the electrode 33 functions as a lower electrode of the capacitor and a capacitance C is formed between the electrode 33 and the upper movable electrode 34.

The size of the capacitance C becomes variable by changing the distance D with the electrode 33 in such a manner that the movable upper electrode 34 is bent as illustrated by the dotted line. With the bending, in the center portion of the movable upper electrode 34, the distance D is shortened by the distance D of approximately 5 μm to 10 μm as compared with that before the deformation.

Note that a dielectric film coming into contact with the bent movable upper electrode 34 may be provided on the upper surface of the electrode 33. In this case, the movable upper electrode 34 comes into contact with the dielectric film, which causes a state where the capacitance C is added (ON state). Then, since a dielectric constant of air is negligible as compared with a dielectric constant of the dielectric film, the movable upper electrode 34 is separated from the dielectric film, which causes a state where the capacitance C is removed from the electrode 33 (OFF state). Note that as such a dielectric film, an alumina film, for example, is available.

In the present embodiment, to bend the movable upper electrode 34 as described above, a positive direct current bias voltage $V_{DC}$ of approximately 30V to 100V is superimposed to the high-frequency signal $S_{RF}$ to be supplied to the electrode 33, and a direct current bias voltage $V_{DC}$ generates an electrostatic field around the electrode 33. Accordingly, the movable upper electrode 34 whose potential is lower than the direct current bias voltage $V_{DC}$ is attracted to the electrode 33 with the electrostatic force, so that the movable upper electrode 34 may be bent.

Then, the magnitude of the direct current bias voltage $V_{DC}$ is changed, so that the size of the capacitance C may be controlled by adjusting a bending amount of the movable upper electrode 34. Also, impedance matching of the electrode 33 provided as a line for the high-frequency signal $S_{RF}$ or modulation of the high-frequency signal $S_{RF}$ may be performed.

Note that in a case where a dielectric film is formed on the upper surface of the electrode 33, the ON state and the OFF state of the capacitance C may be digitally changed by turning ON and OFF the direct current bias voltage $V_{DC}$ which is constantly fixed at an appropriate value.

Figure 4:
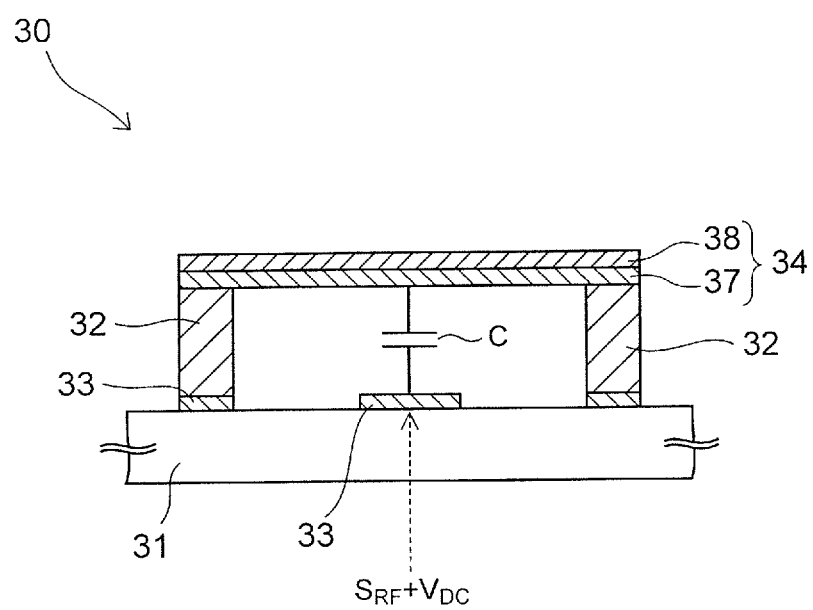
FIG. 4 is a cross-sectional view taken along the I-I line in FIG. 3.

FIG. 4 is a cross-sectional view taken along the I-I line in FIG. 3.

As illustrated in FIG. 4, the movable upper electrode 34 is formed by laminating a metal film 37 and a shape memory alloy film 38 in this order. Note that an order of laminating the metal film 37 and the shape memory alloy film 38 is not limited to this, but the metal layer 37 may be formed in either the uppermost layer or the lowermost layer of the movable upper electrode 34 or on both of them.

As a material for the metal film 37, it is preferable that a metal material with a small electric resistance be used. In the present embodiment, gold is used. Note that in place of gold, a pure metal of aluminum or copper may be used as a material for the metal film 37.

On the other hand, although a temperature equal to or higher than a transformation temperature $T_{th}$ causes deformation, the shape memory alloy film 38 has a property of immediately returning to an original shape. As compared with resilience of the pure metal, the resilience thereof is greater. Such a property is also called as hyperelasticity. In particular, a shape memory alloy whose transformation temperature is about an ordinary temperature or equal to or lower than an ordinary temperature may be sometimes called as a hyperelastic alloy.

In the present embodiment, a TiNi alloy is used as a material for the shape memory alloy film 38, and the shape memory alloy film 38 is caused to memorize a fit shape in advance. A transformation temperature $T_{th}$ of the TiNi alloy may be controlled by a ratio of the number of atoms of Ti to the number of atoms of Ni in the alloy. In the present embodiment, the transformation temperature $T_{th}$ is set to be equal to or lower than a room temperature (25° C.). For example, −20° C. is assumed. Note that even though the transformation temperature $T_{th}$ is about 30° C. to 50° C. which is slightly higher than the room temperature, there is no particular problem as long as the degree of the thermal expansion is small and the expansion is suppressed by mechanical elastic force.

Accordingly, as long as the variable capacitor 30 is used under the temperature about the transformation temperature $T_{th}$ (25° C. to 50° C.) or equal to or higher than that, the shape memory alloy film 38 demonstrates strong force of always returning to the original flat shape. For this reason, even when the metal film 37 is to be bent by the thermal expansion, the shape memory alloy film 38 functions to suppress the bending. Thus, the movable upper electrode 34 may be prevented from being bent by a change in ambient temperature.

As a result, even when the ambient temperature has changed, the bending amount of the movable upper electrode 34 may be precisely controlled by the direct current bias voltage $V_{DC}$ which is applied to the electrode 33. In addition, a predetermined capacitance C may be obtained regardless of the ambient temperature.

In particular, the performance of the shape memory alloy film 38 to prevent the bending is equivalent to 25 times or more as compared with a bimetal when it is converted to work per unit volume. Thus, the shape memory alloy film 38 is preferable to suppress the bending of the movable upper electrode 34.

Note that it is preferable that the transformation temperature $T_{th}$ be equal to or lower than the room temperature as described above in order to cause the shape memory alloy film 38 to always demonstrate the resilience. However, even though the transformation temperature $T_{th}$ is higher than the room temperature for some extent, as long as the transformation temperature $T_{th}$ is within a tolerance of the direct current bias voltage $V_{DC}$ or is within a temperature range in which the deformation due to the heat returns to flat before becoming permanent deformation, there is no practical problem.

Also, when the variable capacitor 30 is used under a high-temperature environment, there is a case where the plastic deformation of the metal film 37, which exceeds the elastic limit, is caused with the thermal expansion and the metal film 37 does not return to the original shape. Even in such a case, it is more preferable that the transformation temperature $T_{th}$ be set to be lower than a temperature T at which the metal film 37 exceeds the elastic limit with the thermal expansion so that the movable upper electrode 34 may be capable of being forcefully returned to the flat shape with the resilience of the shape memory alloy film 38.

Also, the movable upper electrode 34 includes not only the shape memory alloy film 38 but also the metal film 37. Accordingly, the electric resistance of the movable electrode 34 may be made smaller by the metal film 37.

In particular, in a case where a high-frequency signal $S_{RF}$ is applied to the electrode 33 as described in the present embodiment, the high-frequency current flows through the metal film 37 which is the lowermost layer of the movable upper electrode 34 with a skin effect. Thus, the metal film 37 is useful for reducing resistance.

Note that the electrostatic force which is generated from the electrode 33 is set to be stronger than the force of the shape memory alloy film 38 to return to the original shape. Thus, the bending of the movable upper electrode 34 which is caused by the electrostatic force is not disturbed by the shape memory alloy film 38.

Hereinafter, a method of manufacturing a variable capacitor according to the present embodiment is described.

FIGS. 5A to 5H are cross-sectional views of the variable capacitor in the course of manufacturing thereof according to the present embodiment.

Figure 5A:
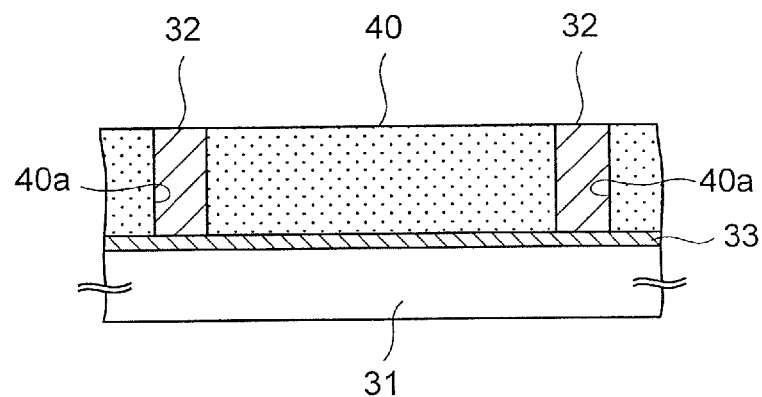
FIGS. 5A to 5H are cross-sectional views of the variable capacitor in the course of manufacturing thereof according to the first embodiment.

Firstly, as illustrated in FIG. 5A, a conductive film made of a pure metal such as a gold film is formed as the electrode 33 with a thickness of 1 µm to 3 µm on the insulating substrate 31 by the sputtering method.

Also, a material for the electrode 33 is not limited to the pure metal but may be an alloy which is made by adding a very small amount of other element to gold, aluminum, or the like. Note that a titanium (Ti) film may be formed as an adhesion film between the gold film and the insulating substrate 31.

Then, after a first resist pattern 40 is formed on the electrode 33, a gold plating film is grown by an electroplating method as the pillar 32 within the opening 40a of the resist pattern 40 by using the electrode 33 as a power feeding layer.

A height of the pillar 32 is not particularly limited. In the present embodiment, the pillar 32 is formed so as to have a height of approximately 5 µm to 6 µm.

After the pillar 32 is formed as described above, the first resist pattern 40 is removed.

Figure 5B:
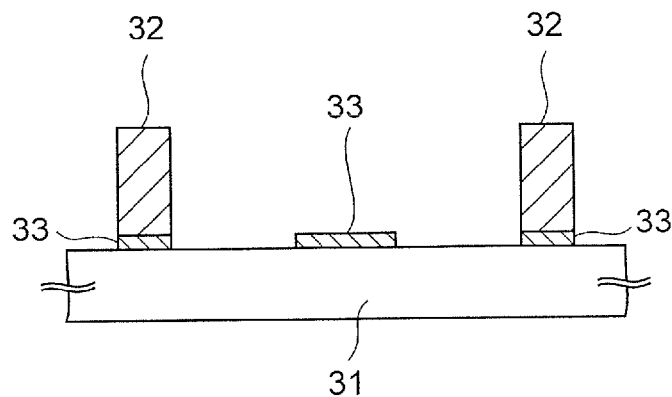

Next, as illustrated in FIG. 5B, the electrode 33 is patterned by the ion milling to leave the electrode 33 in a line shape between the two pillars 32. Note that the electrode 33 is left under the pillars 32 but the electrode 33 under the pillars 32 and the electrode 33 between the two pillars 32 are separated from each other.

Figure 5C:
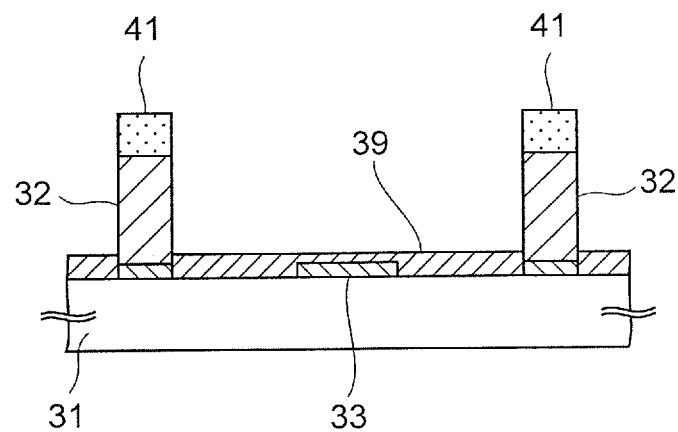

Hereinafter, as illustrated in FIG. 5C, a second resist pattern 41 is formed on the pillar 32. Then, the upper surface of the pillar 32 is protected by the second resist pattern 41, and a copper film is formed by the sputtering method as a seed layer 39 on each of the electrode 33 and the insulating substrate 31.

Note that in a case where a dielectric film is formed on the electrode 33, a region other than the electrode 33 is protected by the resist pattern, and an alumina film is formed as a dielectric film with a thickness of 100 nm to 500 nm by the sputtering method. After that, a seed layer 39 may be formed.

Figure 5D:
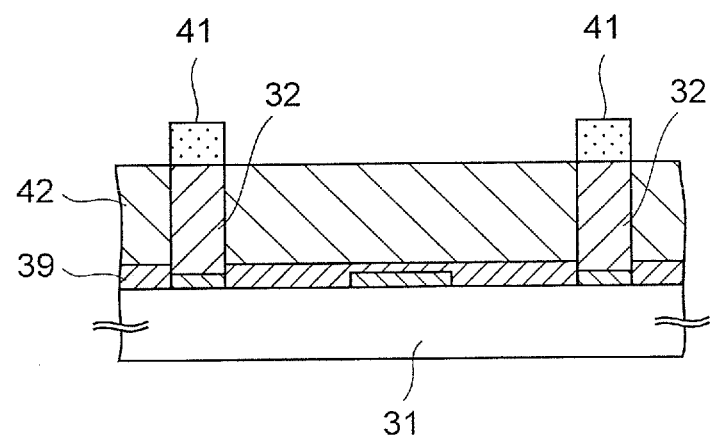

Next, as illustrated in FIG. 5D, a copper plating film is grown to the height same as that of the pillar 32 as a sacrificial film 42 in the region other than the pillars 32 by the electroplating method using the seed layer 39 as a power feeding layer. Note that a material of the sacrificial film 42 is not limited to copper, but may be silicon.

In addition, the upper surface of the sacrificial film 42 which is formed as described above becomes flat.

After that, the second resist pattern 41 is removed to cause the upper surface of the pillar 32 to be exposed from the sacrificial film 42 formed therearound.

Figure 5E:
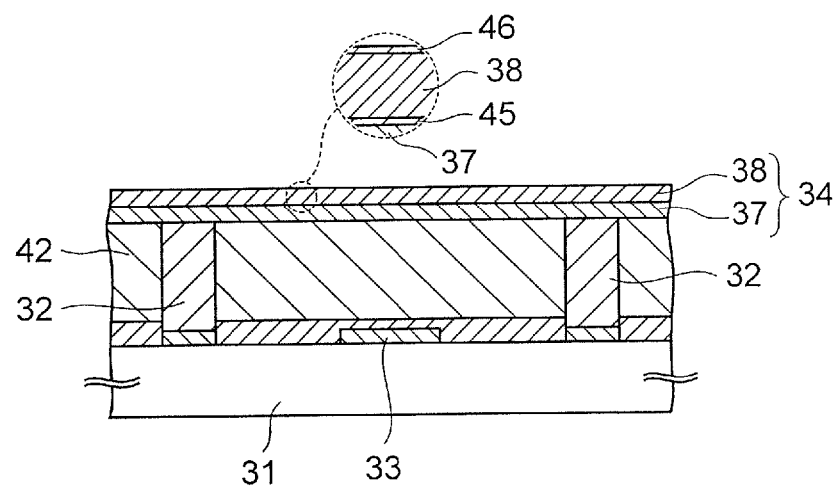

Subsequently, as illustrated in FIG. 5E, a gold film is formed with a thickness of approximately 1 µm to 2 µm by the sputtering method as the metal film 37 on the flat upper surface of the sacrificial film 42 and the pillar 32. Note that in place of the gold film, an aluminum film or a copper film may be formed.

Also, to improve adhesion between the metal film 37 and the pillar 32, a titanium film or a chromium film may be formed in advance as an adhesion film on the pillar 32 and the sacrificial film 42 before the metal film 37 is formed.

Then, a chromium film is formed with a thickness of approximately 300 nm to 500 nm on the metal film 37 by the sputtering method. The resultant chromium film is used as a conductive diffusion prevention film 45. Note that the chromium film also has a function as an adhesion film to increase the adhesion between the metal film 37 and the pillar 32. As an example of such a film, a titanium film is available in addition to the chromium film. Also, a laminated film of any of the chromium film and the titanium film and a platinum film is also a good conductive diffusion prevention film 45.

Furthermore, a TiNi film is formed as a shape memory alloy film 38 on the conductive diffusion prevention film 45 by the sputtering method.

A film thickness of the shape memory alloy film 38 is not particularly limited. However, it is preferable that the thickness be about the same as that of the metal film 37. In the present embodiment, the thickness is set to be approximately 1 µm to 3 µm.

Also, in the sputtering method used when the shape memory alloy film 38 is formed, a sputter target made of a TiNi alloy is used and an argon gas is used as a sputtering gas.

As described above, the transformation temperature $T_{th}$ of the shape memory alloy film 38 is determined by the ratio of the number of atoms of Ti to the number of atoms of Ni in the film. However, the ratio of the number of atoms of Ti to the number of atoms of Ni in the shape memory alloy film 38 is not always same as that in the sputtering target. Thus, it is preferable that the ratio of the number of atoms of Ti to the number of atoms of Ni in the sputtering target, which is suitable for obtaining a predetermined ratio of the number of atoms, be studied in advance.

In the present embodiment, after the study, the ratio of the number of atoms of Ti to the number of atoms of Ni in the shape memory alloy film 38 is adjusted so that the transformation temperature $T_{th}$ would be equal to or lower than a room temperature. For example, −20° C. is assumed.

After that, a chromium film is formed with a thickness of approximately 300 nm to 500 nm by the sputtering method as a conductive oxidation prevention film 46 on the shape memory alloy film 38.

The conductive oxidation prevention film 46 has a function to prevent the shape memory alloy film 38 from oxidizing due to oxygen in atmosphere and thereby suppress the change in the transformation temperature $T_{th}$ due to the change in the ratio of the number of atoms in the shape memory alloy film 38 with oxidation.

On the other hand, the conductive diffusion prevention film 45 under the shape memory alloy film 38 has a function to prevent silicon in the insulating substrate 31 or gold in the pillar 32, or the like from diffusing into the shape memory alloy film 38 and thereby suppress the change in the ratio of the number of atoms of Ti to the number of atoms of Ni in the shape memory alloy film 38.

According to the study carried out by the inventors of the present application, it becomes clear that the chromium film or the platinum film which is formed as the conductive diffusion prevention film 45 or the conductive oxidation prevention film 46 is excellent in oxidation prevention or diffusion prevention with respect to the TiNi film as compared with other films.

With the processes so far, the movable upper electrode 34 which is formed by laminating the metal film 37, the conductive diffusion prevention film 45, the shape memory alloy film 38, and the conductive oxidation prevention film 46 is formed.

Note that the order of forming the metal film 37 and the shape memory alloy film 38 may be reversed. In this case, the conductive diffusion prevention film 45, the shape memory alloy film 38, the conductive oxidation prevention film 46, and the metal film 37 may be formed in this order from the bottom.

Figure 5F:
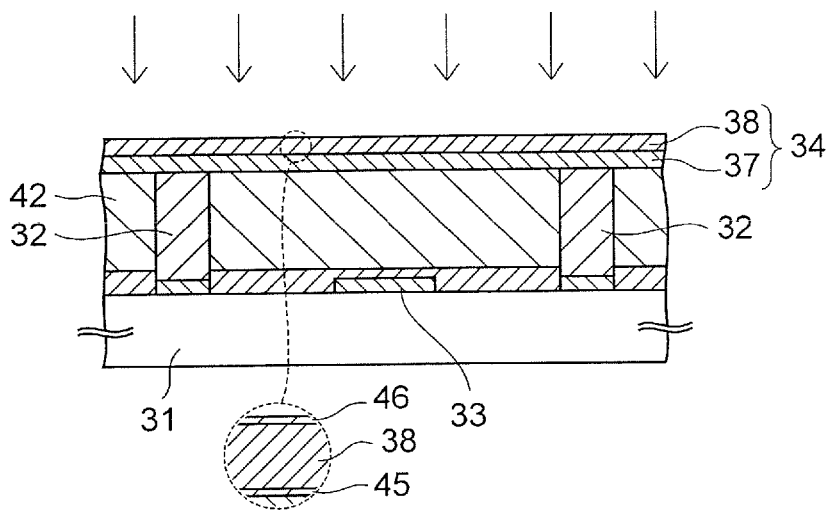

Next, as illustrated in FIG. 5F, heat treatment is performed on the shape memory alloy film 38 in the atmosphere of an inert gas such as argon or in vacuum, so that the shape memory alloy film 38 is caused to memorize a flat shape.

Such heat treatment is also referred to as shape memory treatment. In the present embodiment, the heat treatment is performed under conditions with a substrate temperature of 350° C. to 500° C. and a processing time of 30 minutes to 60 minutes.

Also, the shape memory treatment is performed in an atmosphere of an inert gas or in vacuum, so that the shape memory alloy film 38 may be prevented from oxidizing and causing the transformation temperature to go off from a targeted temperature.

Figure 5G:
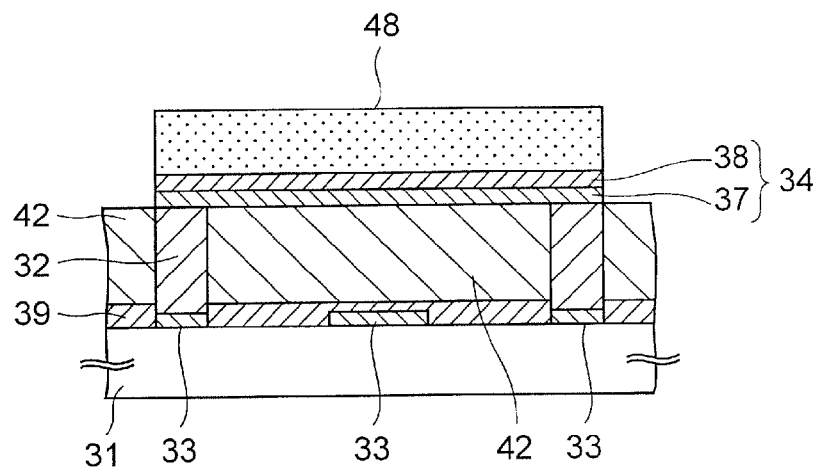

Subsequently, as illustrated in FIG. 5G, a photoresist is applied onto the movable upper electrode 34, which is exposed and developed, so that a second resist pattern 48 with a rectangular planar shape is formed.

Then, while the second resist pattern 48 is used as a mask, the movable upper electrode 34 is patterned by the ion milling using an argon gas, so that the planar shape of the movable upper electrode 34 is shaped into a rectangle.

After that, the second resist pattern 48 is removed.

Note that the shape memory treatment of FIG. 5F may be performed after the movable upper electrode 34 is patterned in this process.

Figure 5H:
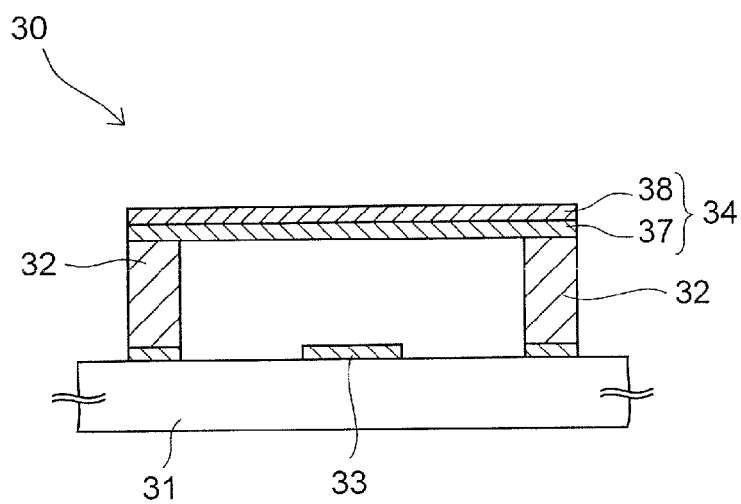

Next, as illustrated in FIG. 5H, the sacrificial film 42 and the seed layer 39 are removed by the RIE (Reactive Ion Etching) or the wet etching.

When the sacrificial film 42 is a silicon film, an $SF_6$ gas may be used as the etching gas for the RIE. Thus, the sacrificial film 42 may be removed without etching the pillar 32 and the movable upper electrode 34.

Also, when the sacrificial film 42 is a copper film, any of a ferric chloride solution, a mixed solution of acetic acid and a hydrogen peroxide solution, an ammonia copper complex solution and the like is used as an etching solution, so that the sacrificial film 42 may be removed.

The sacrificial film 42 is removed as described above, so that the movable upper electrode 34 is released from the restriction of the sacrificial film 42. Thus, the movable upper electrode 34 may be downwardly bent with electrostatic force which is generated by the electrode 33.

Accordingly, the basic structure of the variable capacitor 30 according to the present embodiment is obtained.

Second Embodiment

In the above-described first embodiment, the variable capacitor is described. In the present embodiment, the electrical characteristics of the variable capacitor are improved as follows.

Figure 6A:
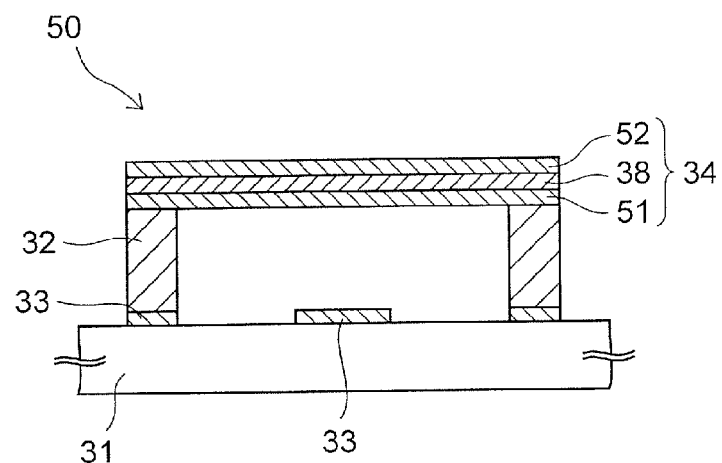
FIGS. 6A and 6B are cross-sectional views of a variable capacitor according to a second embodiment.
Figure 6B:
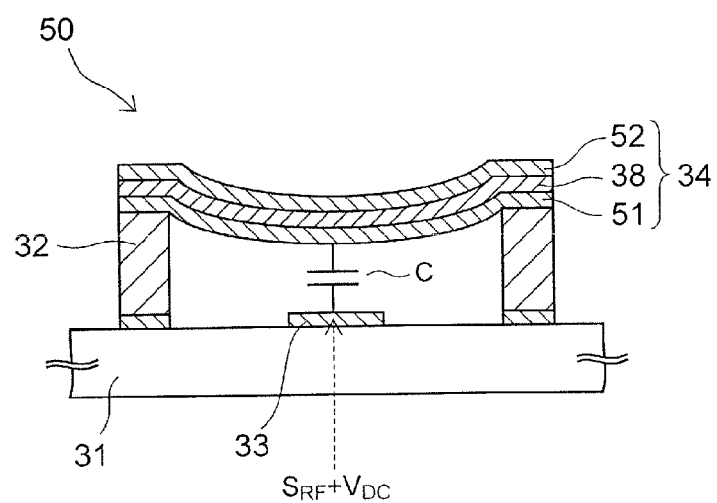

FIGS. 6A and 6B are cross-sectional views of a variable capacitor according to the present embodiment. Note that in FIGS. 6A and 6B, same reference numerals are given to denote elements same as those described in the first embodiment, and the description thereof is omitted below.

As illustrated in FIG. 6A, in a variable capacitor 50 according to the present embodiment, a movable upper electrode 34 is formed as a lamination film of a first metal film 51, a shape memory alloy film 38, and a second metal film 52.

Among them, as a material for the first metal film 51 and the second metal film 52, a pure metal whose electric resistance is smaller than that of the shape memory alloy film 38, such as gold, aluminum, and copper, is used.

On the other hand, the shape memory alloy film 38 is a TiNi film as similar to the first embodiment, and shape memory treatment is performed thereon so as to return to a flat shape at temperature equal to or higher than the transformation temperature $T_{th}$. The transformation temperature $T_{th}$ is equal to or lower than about the room temperature (25° C.). For example, −20° C. is assumed.

In this manner, the variable capacitor 50 is formed by a manufacturing method as similar to that of the first embodiment. The first metal film 51, the shape memory alloy film 38, and the second metal film 52 are sequentially formed and then patterning is performed thereon by the ion milling, so that the movable upper electrode 34 with a rectangular planar shape is obtained.

Also, as illustrated in FIG. 6B, in the present embodiment, the movable upper electrode 34 is bent by superimposing a direct current bias voltage $V_{DC}$ on a high-frequency signal $S_{RF}$ flowing through the electrode 33, and the size of a capacitance C which is formed by the movable upper electrode 34 and the electrode 33 is adjusted.

Here, when the high-frequency signal $S_{RF}$ is supplied to the electrode 33, a current preferentially flows through a surface layer rather than the center of the movable upper electrode 34 with a skin effect.

In the present embodiment, the first and second metal films 51, 52, each of which has a low resistance, are provided in the uppermost layer and the lowermost layer of the movable upper electrode 34 in which the current is concentrated with the skin effect. Accordingly, the attenuation of the high-frequency signal $S_{RF}$ may be reduced, so that the electric characteristic of the variable capacitor 50 may be improved as compared with that of the first embodiment.

Third Embodiment

In the present embodiment, the electric characteristics of the variable capacitor are further improved as follows.

Figure 7A:
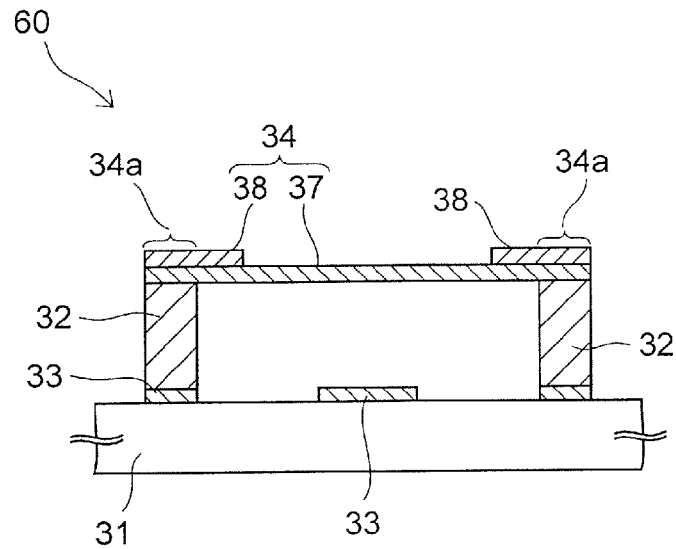
FIGS. 7A and 7B are cross-sectional views of a variable capacitor according to a third embodiment.
Figure 7B:
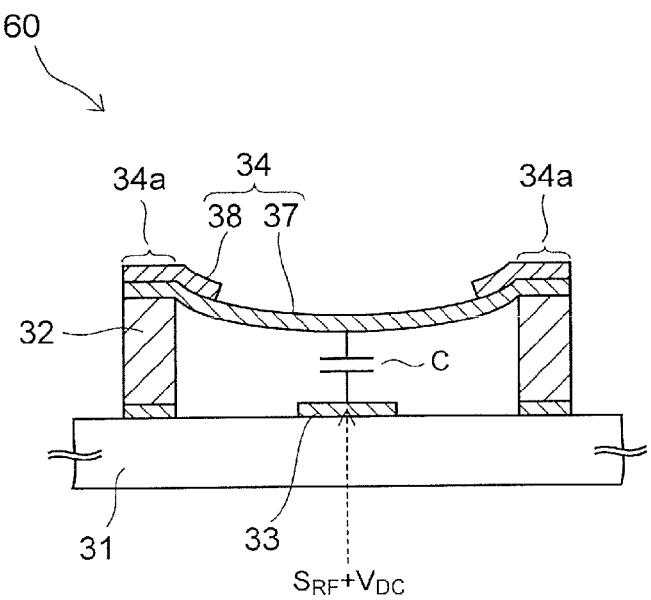

FIGS. 7A and 7B are cross-sectional views of a variable capacitor according to the present embodiment. Note that in FIGS. 7A and 7B, same reference numerals are given to denote elements same as those described in the first embodiment, and the description thereof is omitted below.

As illustrated in FIG. 7A, in a variable capacitor 60 according to the present embodiment, one portion 34a of a movable upper electrode 34 is also fixed on the upper surface of a pillar 32 as similar to the first embodiment.

However, in the present embodiment, a shape memory alloy film 38 is formed to extend from the one portion 34a partway toward a position above the electrode 33 in the movable upper electrode 34.

The way how to bend the movable upper electrode 34 is similar to that of the first embodiment. As illustrated in FIG. 7B, a positive direct current bias voltage $V_{DC}$ is superimposed onto a high-frequency signal $S_{RF}$ flowing through the electrode 33, so that the movable upper electrode 34 is bent with electrostatic force and the size of a capacitance C is adjusted.

Here, as described in the first embodiment, a metal film 37 thermally expands when a temperature around the variable capacitor 60 increases, and thus the metal film 37 tends to be upwardly bent. A portion in which stress is most concentrated in the movable upper electrode 34 when the bending is caused is the one portion 34a fixed on a pillar 32.

Accordingly, a shape memory alloy film 38 is formed so as to cover the one portion 34a as described in the present embodiment, so that the shape memory alloy film 38 can suppress the upward bending of the metal film 37 which is caused with the thermal expansion. Thus, in a state where the direct current bias voltage $V_{DC}$ is not available, the movable upper electrode 34 may be maintained in a flat state.

Moreover, the shape memory alloy film 38 is removed from the upper surface of the metal film 37 above the electrode 33, so that an electric resistance of the movable upper electrode 34 may be reduced as compared with the case where the shape memory alloy film 38 whose electric resistance is high exists on the entire upper surface of the metal film 37.

As a result, the attenuation of the high-frequency signal $S_{RF}$ may be further reduced as compared with the second embodiment and the electric characteristics of the variable capacitor 60 may be enhanced.

Hereinafter, a method of manufacturing the variable capacitor 60 according to the present embodiment is described.

FIGS. 8A to 8E are cross-sectional views of the variable capacitor 60 in the course of manufacturing thereof according to the present embodiment. Note that in these figures, same reference numerals are given to denote elements same as those described in the first embodiment, and the description thereof is omitted below.

Figure 8A:
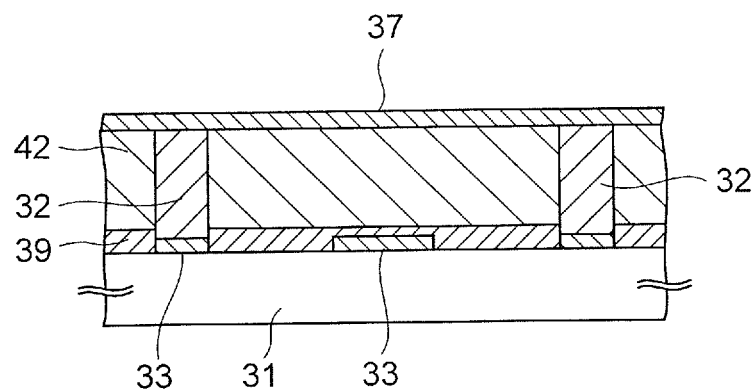
FIGS. 8A to 8E are cross-sectional views of the variable capacitor in the course of manufacturing thereof according to the third embodiment.

To manufacture the variable capacitor 60, firstly the processes of FIGS. 5A to 5D described in the first embodiment are performed, and, then, as illustrated in FIG. 8A, a gold film is formed with a thickness of approximately 1 μm to 2 μm by the sputtering method as a metal film 37 on a flat upper surface of a sacrificial film 42 and a pillar 32. Note that an aluminum film or a copper film may be formed in place of the gold film.

In addition, to improve adhesion between the metal film 37 and the pillar 32, a titanium film or a chromium film may be formed in advance as an adhesion film on the pillar 32 and the sacrificial film 42 before the metal film 37 is formed.

Figure 8B:
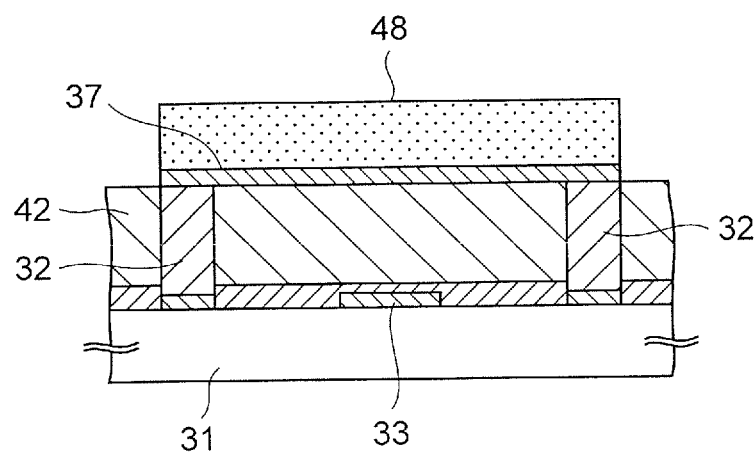

Next, as illustrated in FIG. 8B, while a second resist pattern 48 is used as a mask, the metal film 37 is patterned by the ion milling using an argon gas, so that the planar shape of the metal film 37 is shaped into a rectangle.

After that, the second resist pattern 48 is removed.

Figure 8C:
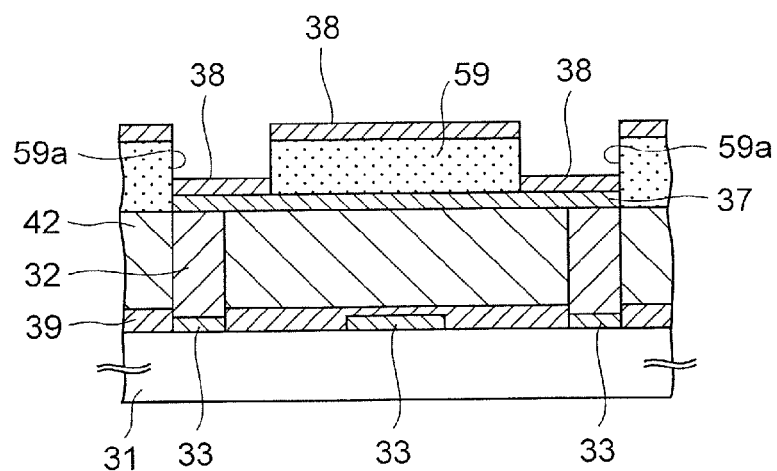

Next, as illustrated in FIG. 8C, a photoresist is applied onto each of the metal film 37 and the sacrificial film 42, which is exposed and developed, so that a third resist pattern 59 having a window 59a above the pillar 32 is formed.

Then, a TiNi film is formed with a thickness of approximately 1 μm to 3 μm in the window 59a and on the third resist pattern 59 as a shape memory alloy film 38 by the sputtering method.

A transformation temperature $T_{th}$ of the shape memory alloy film 38 is determined by a ratio of the number of atoms of Ti to the number of atoms of Ni in the film. The ratio of the number of atoms is properly adjusted, so that the transformation temperature $T_{th}$ is set to be equal to or lower than a room temperature. For example, −20° C. is assumed.

Figure 8D:
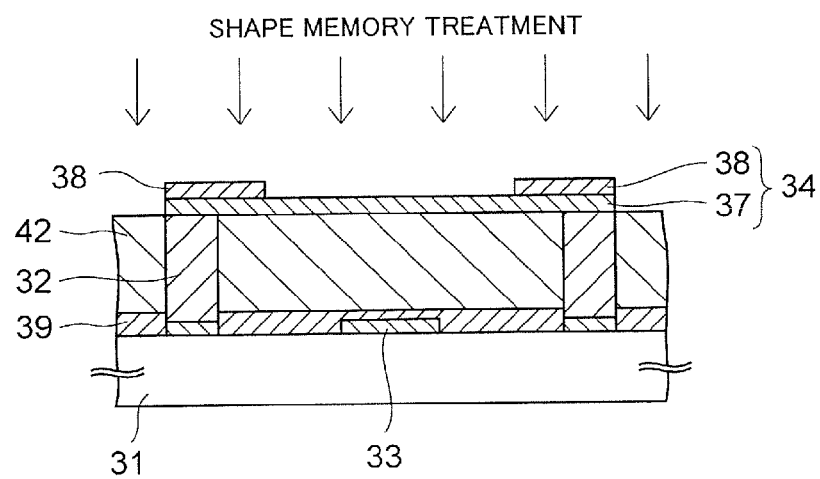

Next, as illustrated in FIG. 8D, the third resist pattern 59 is removed, so that the shape memory alloy film 38 is lifted off to leave the shape memory alloy film 38 above the pillar 32.

With the processes so far, the movable upper electrode 34 including the metal film 37 and the shape memory alloy film 38 is formed.

After that, the shape memory treatment is performed on the shape memory alloy film 38 under conditions with a temperature of 350° C. to 500° C. and a processing time of 30 minutes to 60 minutes to cause the shape memory alloy film 38 to memorize the flat shape.

Figure 8E:
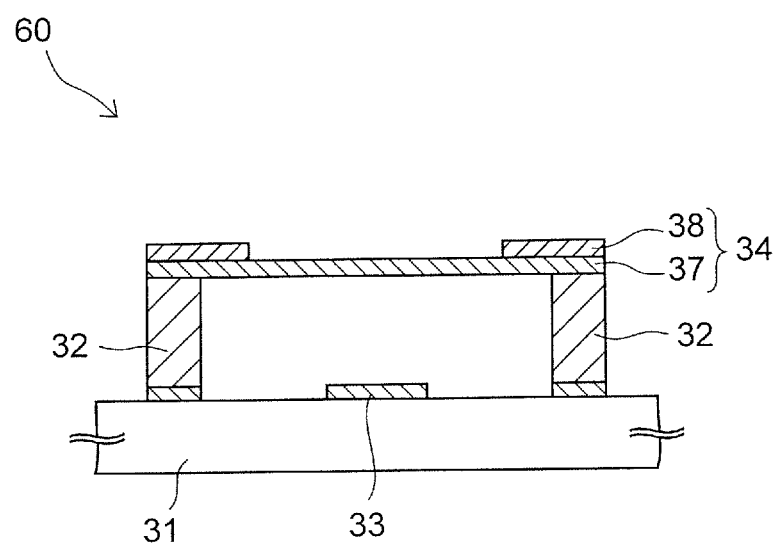

Subsequently, as illustrated in FIG. 8E, the sacrificial film 42 and the seed layer 39 are removed by the RIE or the wet etching. As described in the first embodiment, when the sacrificial film 42 is a silicon film, an $SF_6$ gas is used as an etching gas for the RIE. When the sacrificial film 42 is a copper film, a ferric chloride solution or the like is used as an etching solution.

As described above, the basic structure of the variable capacitor 60 according to the present embodiment is completed.

Fourth Embodiment

The variable capacitors are described in the first to third embodiments. On the other hand, a switch element is described in the present embodiment.

Figure 9:
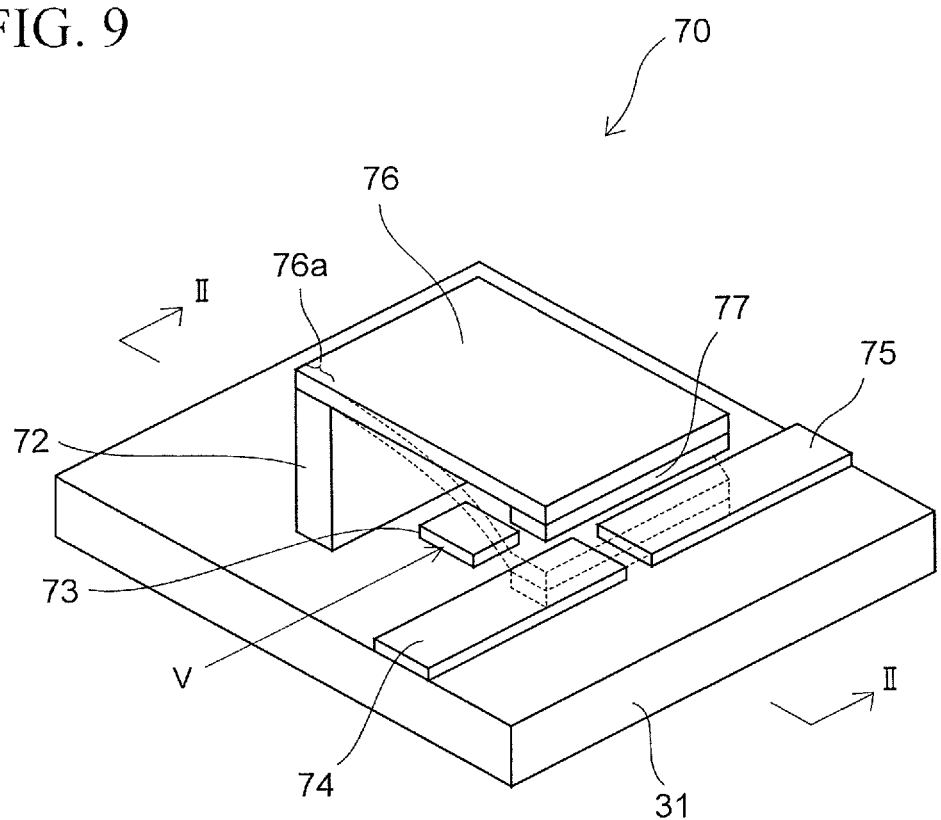
FIG. 9 is a perspective view of a switch element according to a fourth embodiment.

FIG. 9 is a perspective view of a switch element 70 according to the present embodiment.

This switch element 70 includes an insulating substrate 31, a pillar 72, an electrode 73, a first and second conductive patterns 74, 75, a cantilever 76, and a contact 77.

Among them, as a material for the insulating substrate 31, as similar to the variable capacitor according to the first embodiment, any of high-resistance silicon, glass, and ceramic whose impurity concentration is low may be used.

Also, the first conductive pattern 74 and the second conductive pattern 75 are separated by a distance under the contact 77, and are provided as lines for high-frequency signals, for example.

The pillar 72 is formed of a gold plating or the like as described later, and the cantilever 76 provided as a movable portion is provided in an elastic deformable state on the surface thereof. One portion 76a of the cantilever 76 is fixed on the pillar 72 as a fixing end, and an end portion on the other side of the one portion 76a is a vertically movable free end.

In the present embodiment, as described above, the cantilever 76 is mechanically connected with the substrate 31 through the pillar 72.

Also, the pillar 72 and the cantilever 76 are maintained at the ground potential through a high-resistance element with an unillustrated wiring. In addition, an unillustrated insulating layer may be provided between the cantilever 76 and the contact 77 so that the insulating layer isolates the cantilever 76 from the contact 77.

In such a switch element 70, a positive potential V of approximately 30V is applied to the electrode 73, so that the cantilever 76 whose potential is lower than that of the electrode 73 is attracted to the insulating substrate 31 side and then the contact 77 comes into contact with the first and second conductive patterns 74, 75. Accordingly, the first and second conductive patterns 74, 75 are electrically connected with each other through the contact 77, so that the switch is turned on. Thus, a current flows through these first and second conductive patterns 74, 75.

Figure 10:
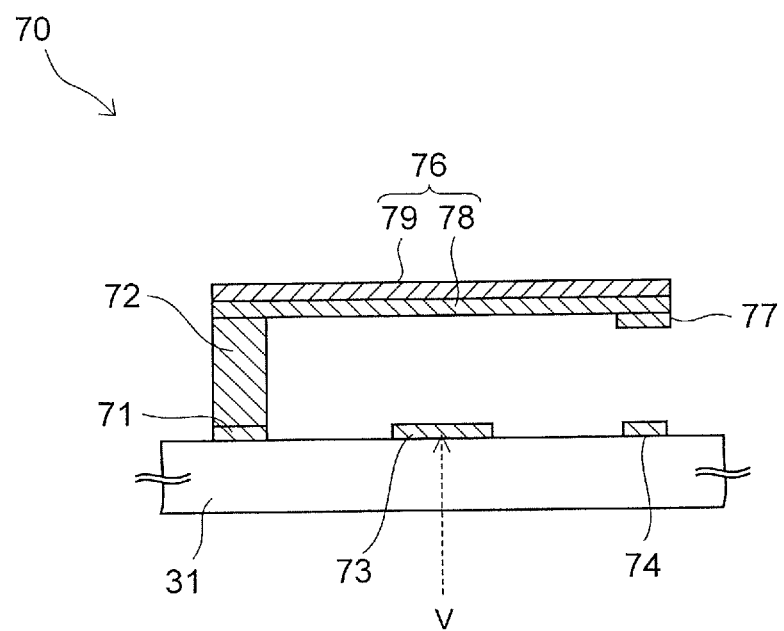
FIG. 10 is a cross-sectional view taken along the II-II line in FIG. 9.

FIG. 10 is a cross-sectional view taken along the II-II line of FIG. 9.

As illustrated in FIG. 10, the cantilever 76 is formed by laminating a metal film 78 and a shape memory alloy film 79 in this order. Note that the order of laminating the films 78, 79 is not limited to this, but it is preferable that the metal film 78 is formed in either the uppermost layer or the lowermost layer of the cantilever 76.

As a material for the metal film 78, it is preferable that a metal material with a small electric resistance be used. In the present embodiment, a pure metal of any of gold, aluminum, and copper is used.

On the other hand, the shape memory alloy film 79 is a TiNi film, for example, and is caused in advance to memorize a flat shape with the shape memory treatment. A transformation temperature $T_{th}$ of the TiNi alloy may be controlled by a ratio of the number of atoms of Ti to the number of atoms of Ni in the alloy. In the present embodiment, the transformation temperature $T_{th}$ is set to be equal to or lower than a room temperature (25° C.). For example, −20° C. is assumed.

Accordingly, when the switch element 70 is used at a temperature equal to or higher than the transformation temperature $T_{th}$, strong force of always returning to an original flat shape is generated in the shape memory alloy film 79. For this reason, even though the metal film 78 is to be bent by thermal expansion or the like, the shape memory alloy film 79 functions to suppress the bending. Thus, the cantilever 76 may be prevented from being bent by a change in ambient temperature.

As a result, even when the ambient temperature changes, the cantilever 76 may be attracted to the insulating substrate 31 side by applying the positive potential V to the electrode 73 and the switch may be turned on.

As described in the first embodiment, the performance of the shape memory alloy film 79 to prevent the bending is equivalent to 25 times or more as compared with a bimetal when it is converted to work per unit volume. Thus, the shape memory alloy film 79 is preferable to suppress the bending of the cantilever 76.

Here, when the switch element 70 is used under a high-temperature environment, there is a case where the plastic deformation of the metal film 78, which exceeds the elastic limit, is caused with the thermal expansion and the metal film 78 does not return to the original shape. Even in such a case, it is preferable that the transformation temperature $T_{th}$ be set to be lower than a temperature T at which the metal film 78 exceeds the elastic limit with the thermal expansion so that the cantilever 76 may be capable of being forcefully returned to the flat shape with the resilience of the shape memory alloy film 79.

Also, the cantilever 76 includes not only the shape memory alloy film 79 but also the metal film 78. Accordingly, the electric resistance of the cantilever 79 may be made smaller by the metal film 78.

In particular, in a case where a high-frequency signal is applied to the first and second conductive patterns 74, 75 (FIG. 9), the high-frequency current flows through the metal film 78 which is the lowermost layer of the cantilever 76 with a skin effect. Thus, the metal film 78 is useful for reducing resistance.

Note that the electrostatic force which is generated from the electrode 73 is set to be stronger than the force of the shape memory alloy film 79 to return to the original shape. Thus, the switching operation which uses the electrostatic force is not disturbed by the shape memory alloy film 79.

Hereinafter, a method of manufacturing a switch element according to the present embodiment is described.

FIGS. 11A to 11H are cross-sectional views of the switch element in the course of manufacturing thereof according to the present embodiment.

Figure 11A:
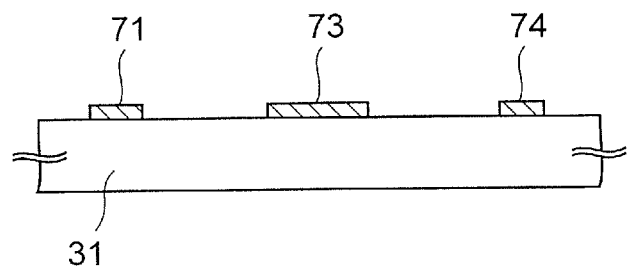
FIGS. 11A to 11H are cross-sectional views of the switch element in the course of manufacturing thereof according to the fourth embodiment.

Firstly, as illustrated in FIG. 11A, a conductive film made of a pure metal such as a gold film is formed with a thickness of approximately 1 μm to 2 μm on the insulating substrate 31 by the sputtering method. The resultant film is patterned to form a base 71, an electrode 73, and a first conductive pattern 74.

Note that a second conductive pattern 75 (see FIG. 9) is formed at the same time in the present process.

Figure 11B:
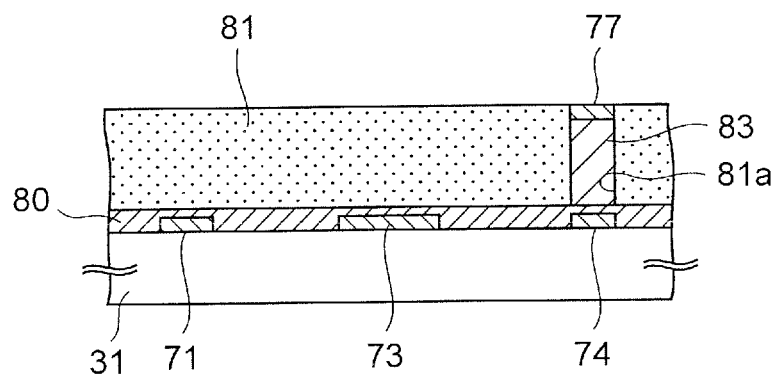

Next, as illustrated in FIG. 11B, a copper film is formed with a thickness of approximately 500 nm by the sputtering method as a seed layer 80 on each of the insulating substrate 31, the base 71, the electrode 73, and the first conductive pattern 74.

After that, a photoresist is applied onto the seed layer 80, which is exposed and developed, so that a first plating resist 81 with a window 81a above the first conductive pattern 74 is formed.

Next, using the seed layer 80 as a power feeding layer, a copper plating film as a first sacrificial film 83 is formed in the window 81a with electroplating. Then, the first sacrificial film 83 is formed until the copper plating film grows to a depth in the middle of the window 81a, and, subsequently using the seed layer 80 as a power feeding layer, an electrolytic gold plating film is formed as a contact 77 on the first sacrificial film 83.

A thickness of the contact 77 is, for example, approximately 0.5 μm to 1 μm.

After that, the first plating resist 81 is removed.

Figure 11C:
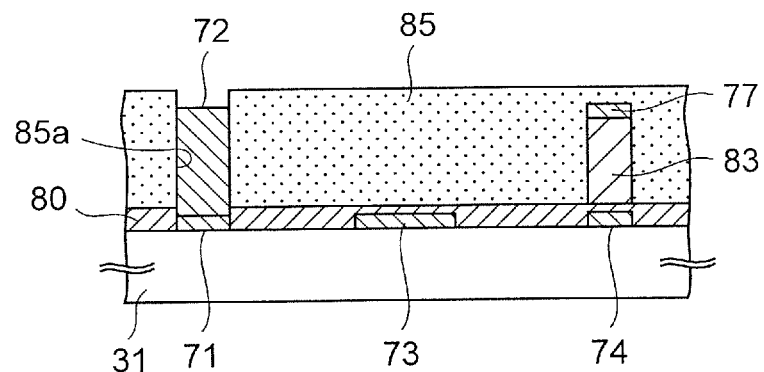

Subsequently, the processes to obtain the cross-sectional structure illustrated in FIG. 11C are described.

Firstly, a photoresist is applied onto the seed layer 80 and the contact 77, which is exposed and developed, so that a second plating resist 85 is formed. The second plating resist 85 includes a window 85a above the base 71.

Next, after the seed layer 80 being exposed from the window 85a is etched, a gold plating film is grown as the pillar 72 on the base 71 in the window 85a with the electroplating while power is continuously fed to the seed layer 80.

A height of the pillar 72 is not particularly limited. In the present embodiment, the pillar 72 is formed so as to have a height of approximately 3 μm to 4 μm.

After that, the second plating resist 85 is removed.

Figure 11D:
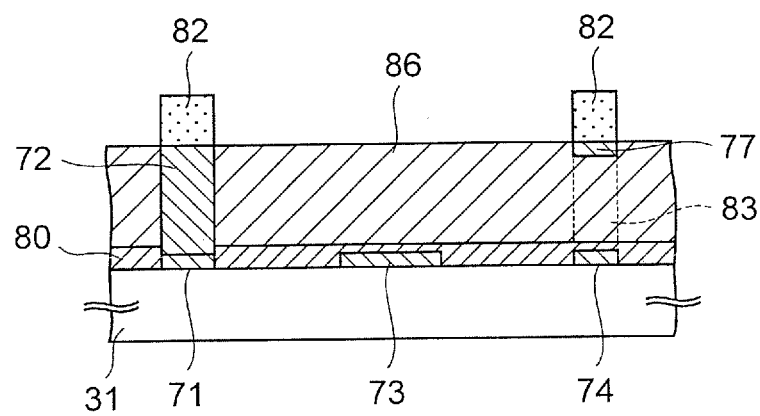

Next, as illustrated in FIG. 11D, a third plating resist 82 is formed on the pillar 72 and the contact 77. Then, while the seed layer 80 is used as a power feeding layer again, a copper plating film with a flat upper surface is formed on the seed layer 80. The resultant copper plating film is used as a second sacrificial film 86.

After that, the third plating resist 82 is removed.

Figure 11E:
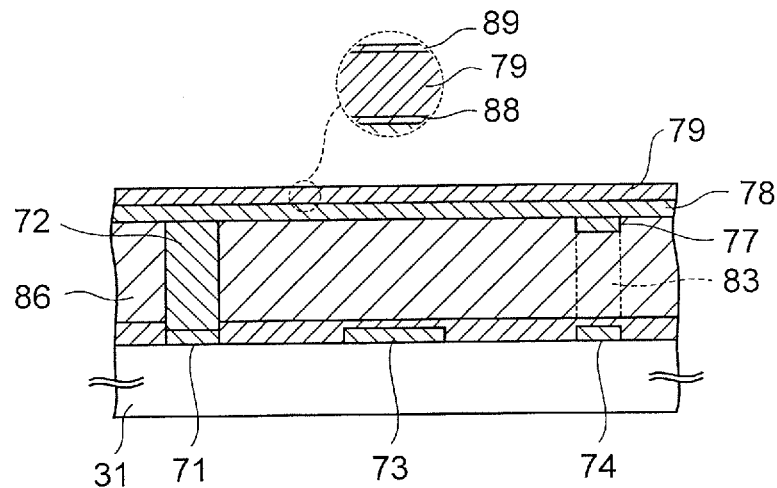

Next, the process to obtain the cross-sectional structure illustrated in FIG. 11E is described.

Firstly, a gold film is formed with a thickness of approximately 1 μm to 2 μm by the sputtering method as the metal film 78 on the flat upper surface of the second sacrificial film 86, the pillar 72, and the contact 77. Note that in place of the gold film, an aluminum film or a copper film may be formed, or a laminated film thereof may be formed.

Also, to improve adhesion between the metal film 78 and the pillar 72, a titanium film or a chromium film may be formed in advance as an adhesion film on the pillar 72 and the second sacrificial film 86 before the metal film 78 is formed.

Then, a chromium film is formed with a thickness of approximately 300 nm to 500 nm on the metal film 78. The resultant chromium film is used as a conductive diffusion prevention film 88.

Furthermore, a TiNi film is formed as a shape memory alloy film 79 on the conductive diffusion prevention film 88 by the sputtering method using a sputtering target made of a TiNi alloy and an argon gas as a sputtering gas.

A film thickness of the shape memory alloy film 79 is not particularly limited. However, it is preferable that the thickness be about the same as that of the metal film 78. In the present embodiment, the thickness is set to be approximately 2 μm to 3 μm.

As described in the first embodiment, in the present embodiment, the ratio of the number of atoms of Ti to the number of atoms of Ni in the shape memory alloy film 79 is adjusted so that the transformation temperature $T_{th}$ would be equal to or lower than a room temperature. For example, −20° C. is assumed.

After that, a chromium film is formed with a thickness of approximately 300 nm to 500 nm by the sputtering method as a conductive oxidation prevention film 89 on the shape memory alloy film 79.

The conductive oxidation prevention film 89 has a function to prevent the shape memory alloy film 79 from oxidizing and thereby suppress the change in the transformation temperature $T_{th}$. Note that if there is no problem on the change in the transformation temperature, the conductive oxidation prevention film 89 may be omitted.

On the other hand, the conductive diffusion prevention film 88 under the shape memory alloy film 79 has a function to prevent silicon in the insulating substrate 31 or gold in the pillar 72, or the like from diffusing into the shape memory alloy film 79 and thereby suppress the change in the ratio of the number of atoms of Ti to the number of atoms of Ni in the shape memory alloy film 79.

Figure 11F:
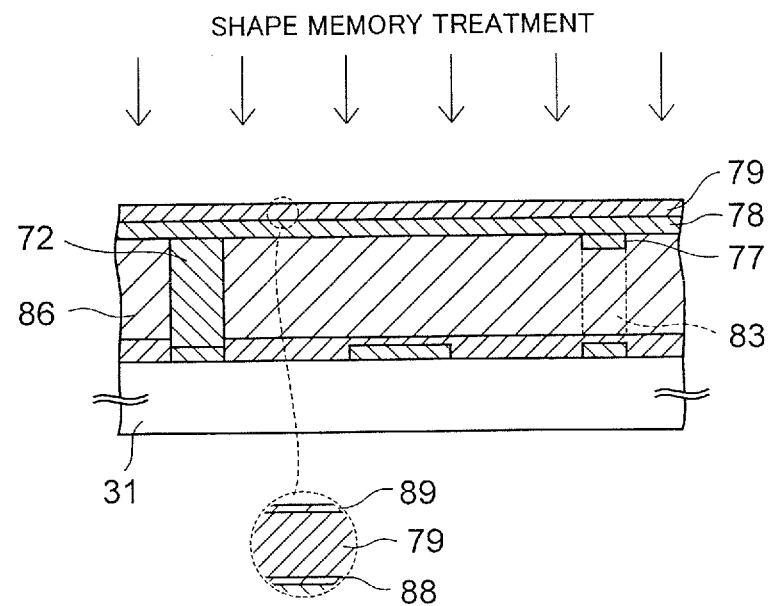

Next, as illustrated in FIG. 11F, shape memory treatment is performed on the shape memory alloy film 79 in the atmosphere of an inert gas such as argon or in vacuum, so that the shape memory alloy film 79 is caused to memorize a flat shape.

Conditions for the shape memory treatment are not particularly limited. As the conditions, a substrate temperature of 350° C. to 500° C. and a processing time of 30 minutes to 60 minutes are used.

Figure 11G:
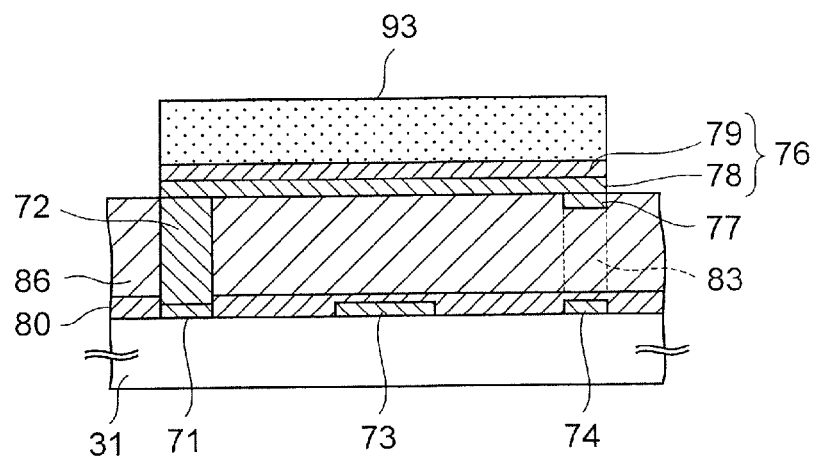

Subsequently, as illustrated in FIG. 11G, a first resist pattern 93 is formed on the shape memory alloy film 79. Then, while the first resist pattern 93 is used as a mask, the shape memory alloy film 79 and the metal film 78 are patterned by the ion milling using an argon gas, so that a planar shape of these films is shaped into a rectangle.

After that, the first resist pattern 93 is removed.

With the processes so far, the cantilever 76 which is formed by laminating the metal film 78 and the shape memory alloy film 79 is formed.

Figure 11H:
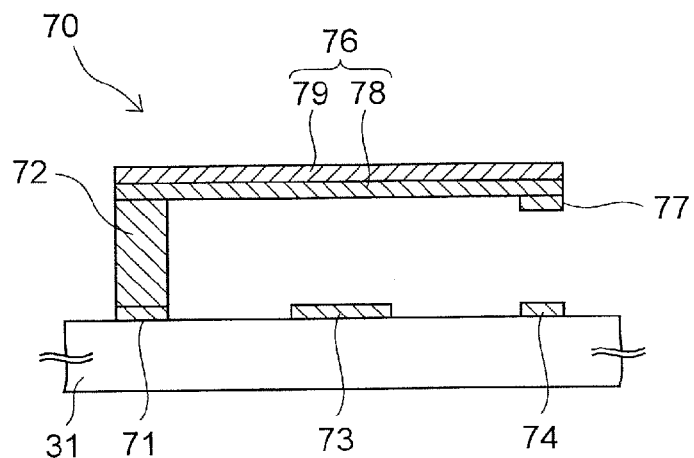

Thereafter, as illustrated in FIG. 11H, the seed layer 80 and the first and second sacrificial films 83, 86 are removed by the wet etching. When the first and second sacrificial films 83, 86 are copper films, as an etching solution capable of being used in the present process, any of a ferric chloride solution, a mixed solution of acetic acid and a hydrogen peroxide solution, an ammonia copper complex solution and the like is available.

Also, the present process may be performed by RIE in place of the wet etching.

The first and second sacrificial films 83, 86 are removed as described above, so that the cantilever 76 is released from the restriction of the first and second sacrificial films 83, 86. Thus, the cantilever 76 may be downwardly bent with electrostatic force which is generated from the electrode 73.

Accordingly, the basic structure of the switch element 70 according to the present embodiment is completed.

Fifth Embodiment

In the above-described fourth embodiment, the switch element is described. In the present embodiment, the electric characteristics of the switch element are improved as follows.

Figure 12A:
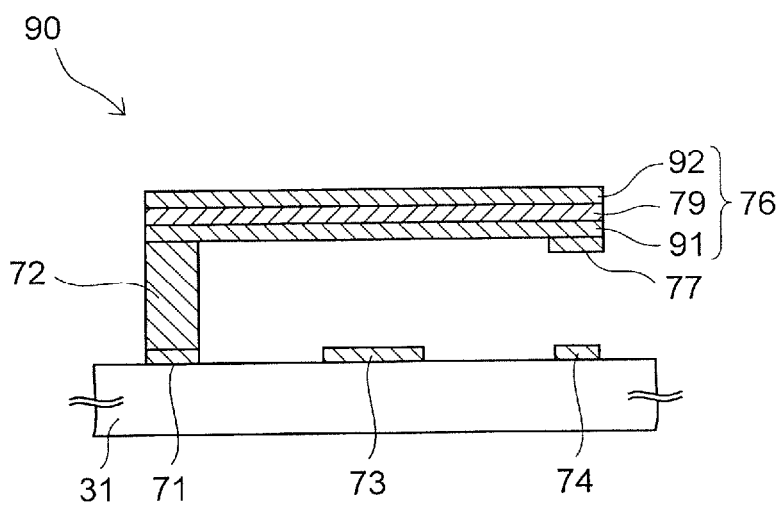
FIGS. 12A and 12B are cross-sectional views of a switch element according to a fifth embodiment.
Figure 12B:
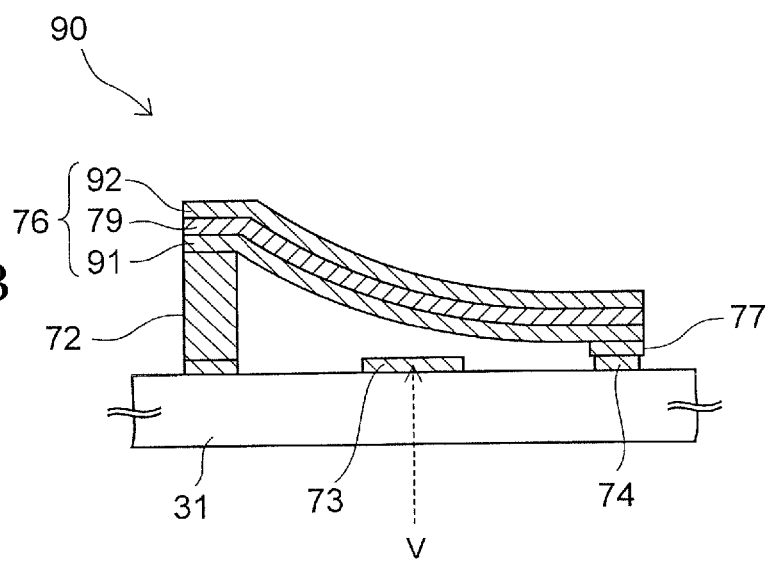

FIGS. 12A and 12B are cross-sectional views of a switch element according to the present embodiment. Note that in FIGS. 12A and 12B, same reference numerals are given to denote elements same as those described in the fourth embodiment, and the description thereof is omitted below.

As illustrated in FIG. 12A, in a switch element 90 according to the present embodiment, a cantilever 76 is formed as a lamination film of a first metal film 91, a shape memory alloy film 79, and a second metal film 92.

Among them, as a material for the first metal film 91 and the second metal film 92, a pure metal whose electric resistance is smaller than that of the shape memory alloy film 79, such as gold, aluminum, and copper, is used.

On the other hand, the shape memory alloy film 79 is a TiNi film as similar to the fourth embodiment, and shape memory treatment is performed thereon so as to return to a flat shape at temperature equal to or higher than the transformation temperature $T_{th}$. The transformation temperature $T_{th}$ is equal to or lower than about the room temperature (25° C.). For example, −20° C. is assumed.

In this manner, the switch element 90 is formed by a manufacturing method as similar to that of the fourth embodiment. The first metal film 91, the shape memory alloy film 79, and the second metal film 92 are sequentially formed and then patterning is performed on the films by the ion milling, so that the cantilever 76 with a rectangular planar shape is obtained.

In addition, as illustrated in FIG. 12B, in the present embodiment, the cantilever 76 is also bent by applying a positive potential V to the electrode 73. Accordingly, a contact 77 comes into contact with each of the first conductive pattern 74 and the second conductive pattern 75 (see FIG. 9), so that a switch is turned on between the first and second conductive patterns 74, 75.

Here, when the high-frequency signal is supplied to the first and second conductive patterns 74, 75, in the state where the switch is turned on, a current preferentially flows through a surface layer rather than the center of the cantilever 76 with a skin effect.

In the present embodiment, the first and second metal films 91, 92, each of which has a low resistance, are provided in the uppermost layer and the lowermost layer of the cantilever 76 in which the current is concentrated with the skin effect. Accordingly, the attenuation of the high-frequency signal may be reduced, so that the electric characteristic of the switch element 90 may be improved as compared with that of the fourth embodiment.

Sixth Embodiment

Figure 13A:
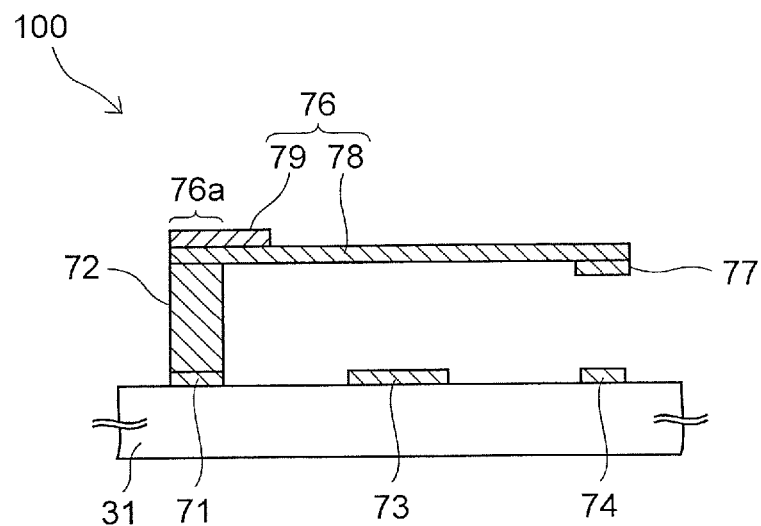
FIGS. 13A and 13B are cross-sectional views of a switch element according to a sixth embodiment.
Figure 13B:
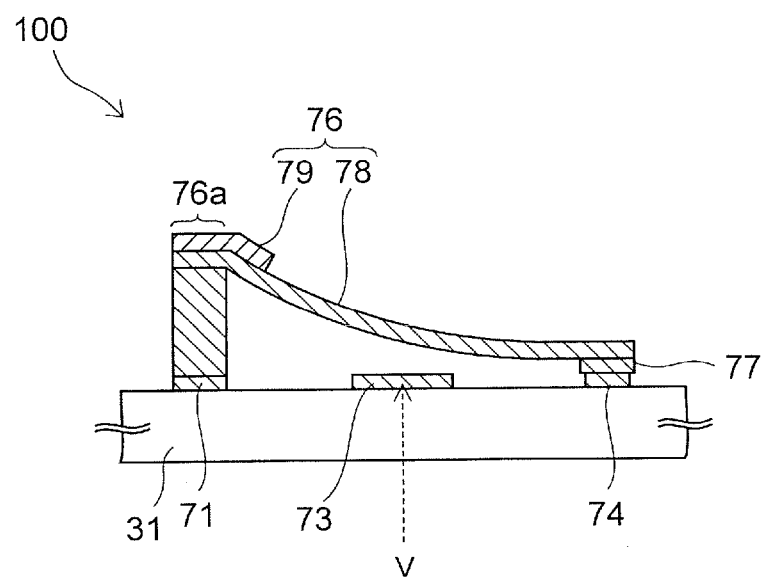

In the present embodiment, the electric characteristics of the switch element are further improved as follows FIGS. 13A and 13B are cross-sectional views of a switch element according to the present embodiment. Note that in FIGS. 13A and 13B, same reference numerals are given to denote elements same as those described in the fourth embodiment, and the description thereof is omitted below.

As illustrated in FIG. 13A, in a switch element 100 according to the present embodiment, one portion 76a of a cantilever 76 is also fixed on the upper surface of a pillar 72 as similar to the fourth embodiment.

However, in the present embodiment, a shape memory alloy film 79 is formed to extend from the one portion 76a partway toward a position above the electrode 73 in the cantilever 76.

The way how to bend the cantilever 76 is similar to that of the fourth embodiment. As illustrated in FIG. 13B, a positive potential V is applied to the electrode 73, so that switching is performed by bending the cantilever 76 with electrostatic force.

Here, a metal film 78 thermally expands when a temperature around the switch element 100 increases, and thus the metal film 78 tends to be upwardly bent. A portion in which stress is most concentrated in the cantilever 76 caused by the bending is the one portion 76a fixed on a pillar 72.

Accordingly, a shape memory alloy film 79 is formed so as to cover the one portion 76a as described in the present embodiment, so that the shape memory alloy film 79 may suppress the upward bending of the metal film 78 which is caused with the thermal expansion. Thus, in a state in which the positive potential V is not applied, the cantilever 76 may be maintained in a flat state.

Moreover, the shape memory alloy film 79 is removed from the upper surface of the metal film 78 in the periphery of the contact 77, so that an electric resistance of the cantilever 76 may be reduced as compared with the case where the shape memory alloy film 79 whose electric resistance is high exists on the entire upper surface of the metal film 78.

As a result, even in the case where the high-frequency signal is flown through the first and second conductive patterns 74, 75 (see FIG. 9) and the current flows through the cantilever 76 with the skin effect, the attenuation of the current in the cantilever 76 may be prevented, and the electric characteristics of the switch element 100 may be enhanced.

Hereinafter, a method of manufacturing the switch element 100 is described.

FIGS. 14A to 14E are cross-sectional views of the switch element 100 in the course of manufacturing thereof according to the present embodiment. Note that in these figures, same reference numerals are given to denote elements same as those described in the fourth embodiment, and the description thereof is omitted below.

To manufacture the switch element 100, firstly the processes of FIGS. 11A to 11D described in the fourth embodiment are performed.

Figure 14A:
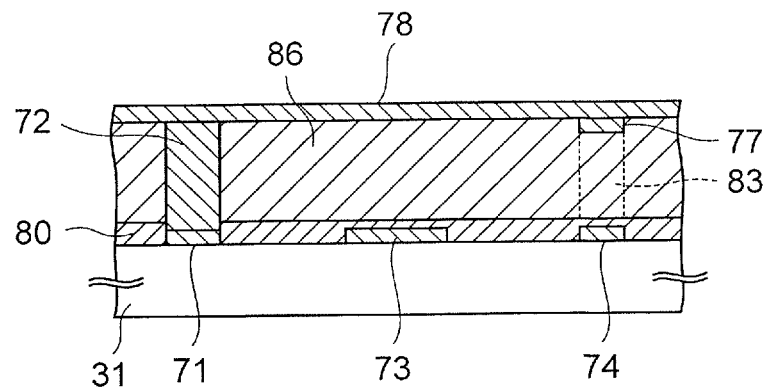
FIGS. 14A to 14E are cross-sectional views of the switch element in the course of manufacturing thereof according to the sixth embodiment.

Then, as illustrated in FIG. 14A, a gold film is formed with a thickness of approximately 1 µm to 2 µm by the sputtering method as a metal film 78 on each of a flat upper surface of a second sacrificial film 86, a pillar 72, and a contact 77. Note that an aluminum film or a copper film may be formed in place of the gold film, or a lamination film thereof may be formed.

Furthermore, to improve adhesion between the metal film 78 and the pillar 72, a titanium film or a chromium film may be formed in advance as an adhesion film on the pillar 72 and the second sacrificial film 86 before the metal film 78 is formed.

Figure 14B:
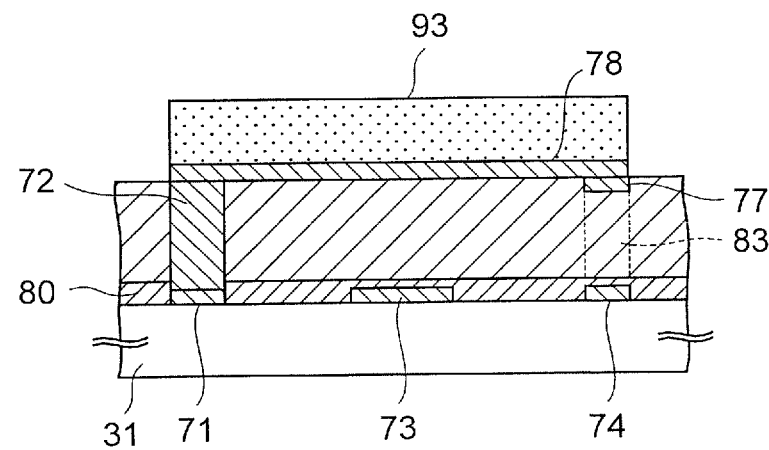

Next, as illustrated in FIG. 14B, while a first resist pattern 93 is used as a mask, the metal film 78 is patterned by the ion milling using an argon gas, so that the planar shape of the metal film 78 is shaped into a rectangle.

After that, the first resist pattern 93 is removed.

Figure 14C:
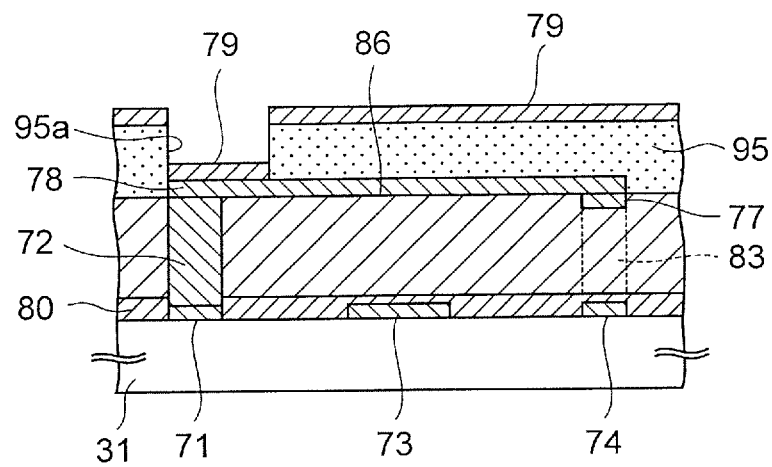

Next, as illustrated in FIG. 14C, a photoresist is applied onto each of the metal film 78 and the second sacrificial film 86, which is exposed and developed, so that a second resist pattern 95 having a window 95a above the pillar 72 is formed.

Then, a TiNi film is formed with a thickness of approximately 1 µm to 3 µm in the window 95a and on the second resist pattern 95 by the sputtering method as a shape memory alloy film 79.

A ratio of the number of atoms of Ti to the number of atoms of Ni in the shape memory alloy film 79 is properly adjusted, so that the transformation temperature $T_{th}$ of the shape memory alloy film 79 is set to be equal to or lower than a room temperature. In the present embodiment, for example, −20° C. is assumed.

Figure 14D:
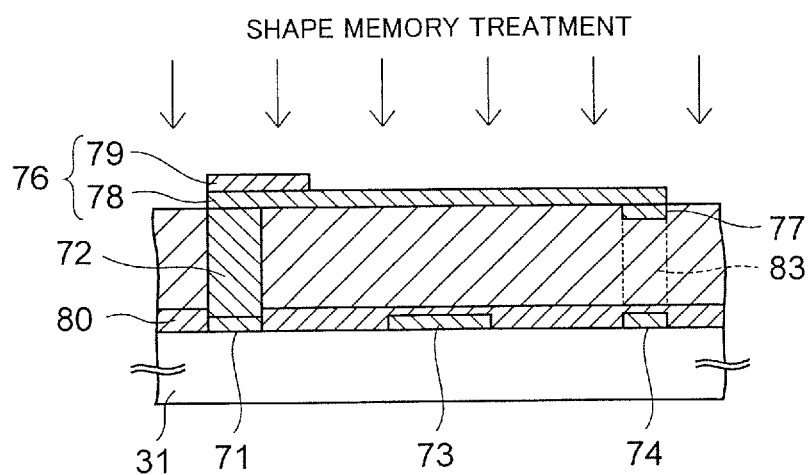

Next, as illustrated in FIG. 14D, the second resist pattern 95 is removed, so that the shape memory alloy film 79 is lifted off to leave the shape memory alloy film 79 above the pillar 72.

With the processes so far, the cantilever 76 including the metal film 78 and the shape memory alloy film 79 is formed.

After that, the shape memory treatment is performed on the shape memory alloy film 79 under conditions with a temperature of 350° C. to 500° C. and a processing time of 30 minutes to 60 minutes to cause the shape memory alloy film 79 to memorize the flat shape.

Figure 14E:
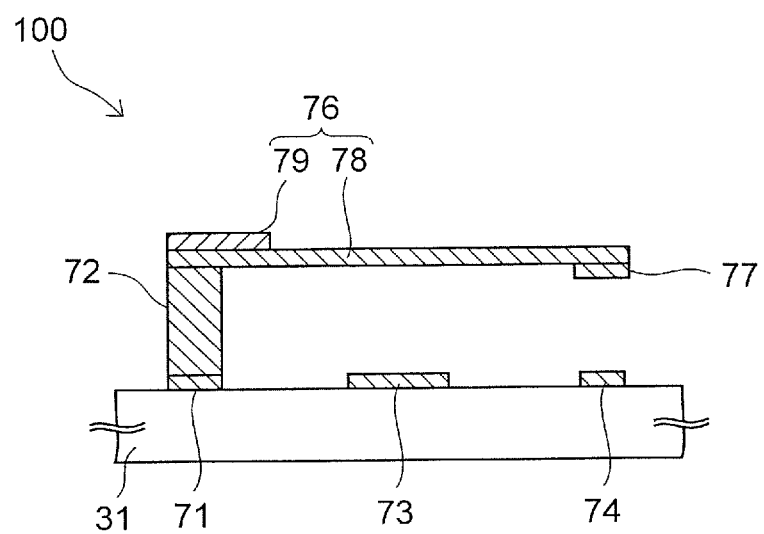

Subsequently, as illustrated in FIG. 14E, the seed layer 80 and the first and second sacrificial films 83, 86 are removed by the wet etching using an etching solution such as a ferric chloride solution.

As described above, the basic structure of the switch element 100 according to the present embodiment is completed.

Seventh Embodiment

In the present embodiment, a variable capacitor is formed as an electronic device.

In the first embodiment, as illustrated in FIG. 3, a direct current bias voltage $V_{DC}$ is superimposed onto the high-frequency signal $S_{RF}$ to cause the electrode 33 to have both a function as a line for the high-frequency signal $S_{RF}$ and a function as a drive electrode to bend the movable upper electrode 34.

On the other hand, in the present embodiment, the line and the drive electrode are separated from each other as follows.

FIGS. 15A to 15I are cross-sectional views of a variable capacitor in the course of manufacturing thereof according to the present embodiment.

Figure 15A:
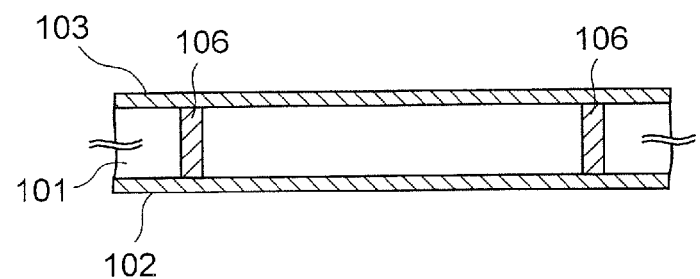
FIGS. 15A to 15I are cross-sectional views of a variable capacitor in the course of manufacturing thereof according to a seventh embodiment.

Firstly, as illustrated in FIG. 15A, an insulating substrate 101 such as a ceramic substrate is prepared. A through wiring 106 using copper as a material is provided in the insulating substrate 101. A ground layer 102 such as a copper film is formed on the back surface of the insulating substrate 101.

Then, a titanium (Ti) film is formed as an adhesion film with a thickness of approximately 50 nm to 100 nm on the upper surface of the insulating substrate 101 by the sputtering method. Thereafter, a gold film is formed with a thickness of approximately 200 nm to 1000 nm thereon by the sputtering method. These gold film and titanium films are used as a conductive film 103.

Figure 15B:
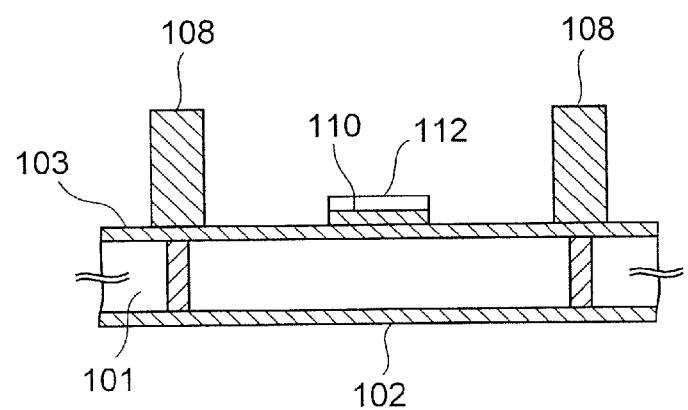

Next, as illustrated in FIG. 15B, with the additive method using an unillustrated resist pattern as a plating resist, a pillar 108 and a line 110 are formed with electrolytic gold plating. The line 110 becomes one portion of a micro-strip line in cooperation with the ground layer 102.

Note that a height of the pillar 108 is approximately 5 μm to 6 μm and a height of the line 110 is approximately 2 μm to 3 μm. To form two types of patterns having different heights, it is preferable that a plating resist is formed again and the additive method is performed twice.

Also, a dielectric film 112 such as an alumina film may be formed by the sputtering method in a state where the plating resist used for forming the line 110 is still left. The plating resist is removed after the dielectric film 112 is formed, so that the dielectric film 112 may be selectively formed on the upper surface of the line 110.

Note that a film thickness of the dielectric film 112 is approximately 200 nm to 500 nm.

Figure 15C:
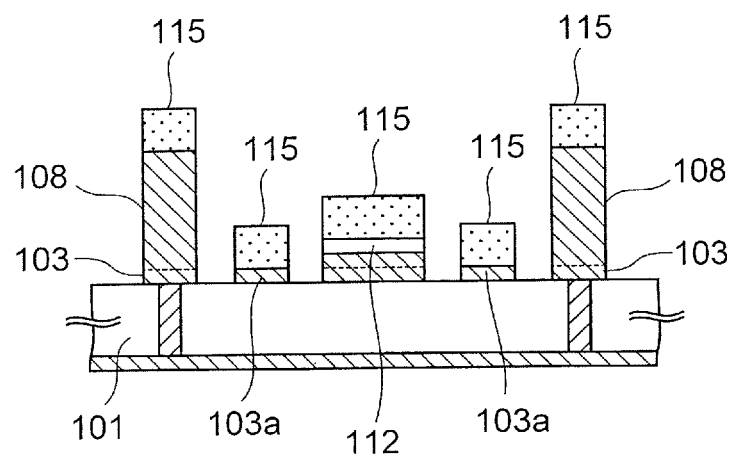

Subsequently, as illustrated in FIG. 15C, while the upper surfaces of the pillar 108 and the dielectric film 112 are protected with the first resist pattern 115, the conductive film 103 is patterned by the ion milling, so that a drive electrode 103a is formed between the pillar 108 and the line 110.

After that, the first resist pattern 115 is removed.

Figure 15D:
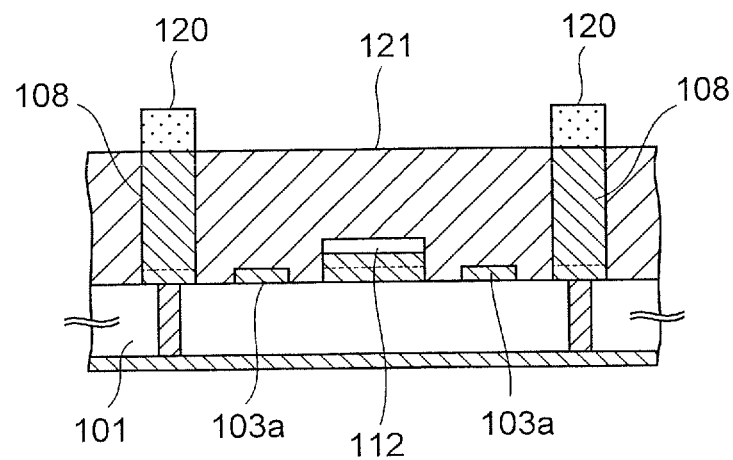

Next, as illustrated in FIG. 15D, while the upper surface of the pillar 108 is covered with the second resist pattern 120, an unillustrated copper film is formed with a thickness of approximately 50 nm to 100 nm by the sputtering method as seed layer on the entire upper surface of the insulating substrate 101.

Then, an electrolytic copper plating is performed by using the seed layer as a power feeding layer, so that a copper plating film with a flat upper surface is grown as a sacrificial film 121 to have a height of the pillar 108.

After that, the second resist pattern 120 is removed.

Figure 15E:
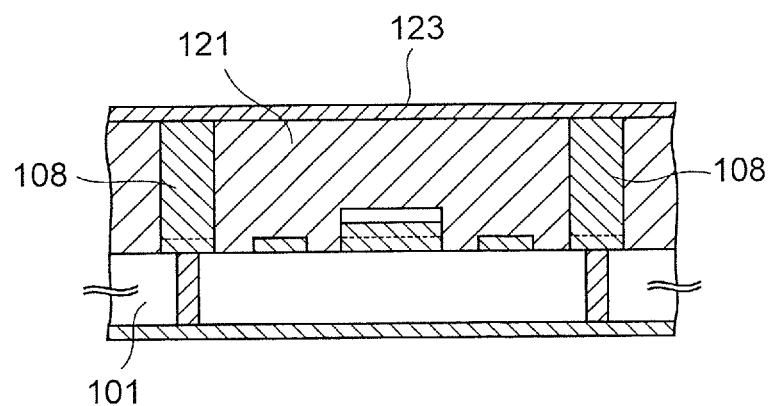

Subsequently, as illustrated in FIG. 15E, a gold film is formed with a thickness of approximately 1 μm to 2 μm by the sputtering method as a metal film 123 on the flat upper surface of the sacrificial film 121 and the pillar 108. Note that before the gold film is formed, a titanium film may be formed with a thickness of approximately 50 nm to 100 nm by the sputtering method as an adhesion film on the pillar 108 and the sacrificial film 121.

Figure 15F:
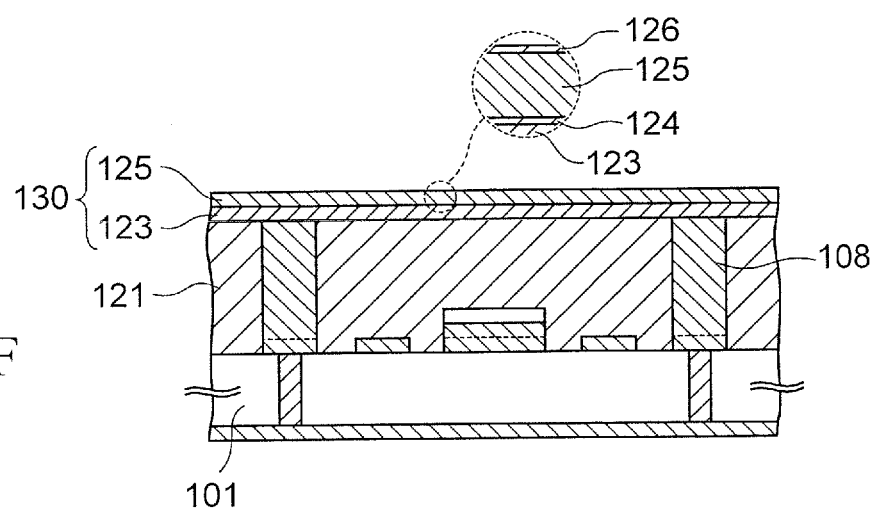

Hereinafter, the processes to obtain the cross-sectional structure illustrated in FIG. 15F are described.

Firstly, a chromium film is formed with a thickness of approximately 300 nm to 500 nm on the metal film 123 by the sputtering method. The resultant chromium film is used as a conductive diffusion prevention film 124.

Then, a plurality of titanium films and nickel films is alternately formed as a shape memory alloy film 125 on the conductive diffusion prevention film 124 by the sputtering method. In this case, film thicknesses of the titanium film and the nickel film are both approximately 5 nm to 100 nm. Also, the film thickness of the shape memory alloy film 125 obtained by laminating them as described above is approximately 1 μm to 3 μm.

Then, the final ratio of the number of atoms of titanium to the number of atoms of nickel in the shape memory alloy film 125 may be adjusted by a ratio of the film thickness of the titanium film to the film thickness of the nickel film.

As described above, the lamination film of the titanium film and the nickel film is used as the shape memory alloy film 125, so that the ratio of the number of atoms in the shape memory alloy film becomes easily controlled.

Note that, in place of the lamination film, a single layer TiNi alloy may be formed as the shape memory alloy film 125 by the sputtering method by using a sputtering target of the shape memory alloy in which the ratio of the number of atoms of titanium to the number of atoms of nickel is adjusted.

Thereafter, a chromium film is formed again with a thickness of approximately 300 nm to 500 nm on the shape memory alloy film 125 by the sputtering method. The resultant chromium film is used as a conductive oxidation prevention film 126.

The conductive oxidation prevention film 126 has a function to prevent the shape memory alloy film 125 from oxidizing due to oxygen in atmosphere and thereby suppress the change in the transformation temperature $T_{th}$ due to the change in the ratio of the number of atoms in the shape memory alloy film 125 with oxidation.

On the other hand, the conductive diffusion prevention film 124 under the shape memory alloy film 125 has a function to prevent silicon in the insulating substrate 101 or gold in the pillar 108, or the like from diffusing into the shape memory alloy film 125 and thereby suppress the change in the ratio of the number of atoms of Ti to the number of atoms of Ni in the shape memory alloy film 125.

With the processes so far, the movable upper electrode 130 which is formed by laminating the metal film 123, the conductive diffusion prevention film 124, the shape memory alloy film 125, and the conductive oxidation prevention film 126 is formed.

Figure 15G:
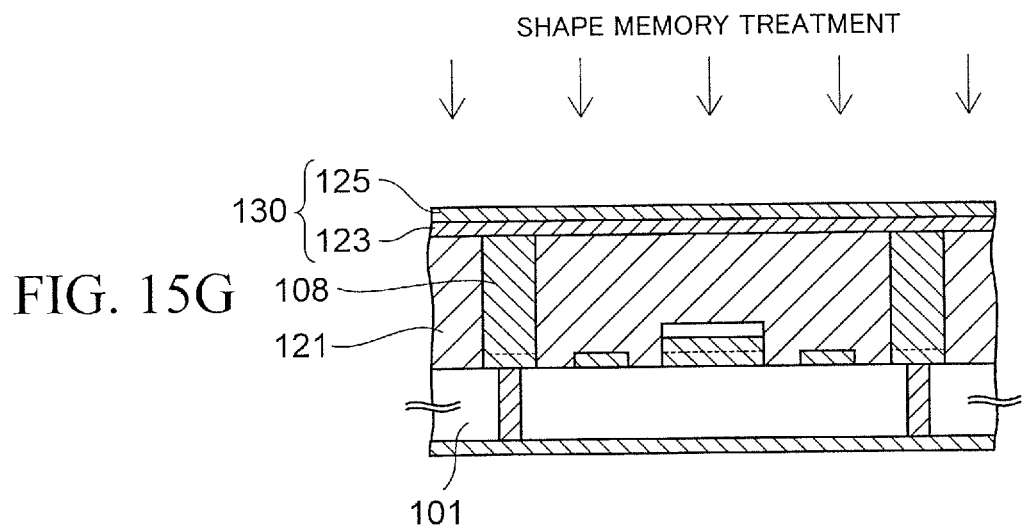

Next, as illustrated in FIG. 15G, shape memory treatment is performed on the shape memory alloy film 125 with heat in a vacuum furnace, so that the shape memory alloy film 125 is caused to memorize a flat shape. As the conditions for the shape memory alloy treatment, a substrate temperature of 300° C. to 500° C. and a processing time of 30 minutes to 60 minutes are employed.

Also, the shape memory treatment plays a role as solutionizing treatment with respect to the shape memory alloy film 125, and the titanium film and the nickel film in the shape memory alloy film 125 are caused to be alloy with the shape memory treatment.

Figure 15H:
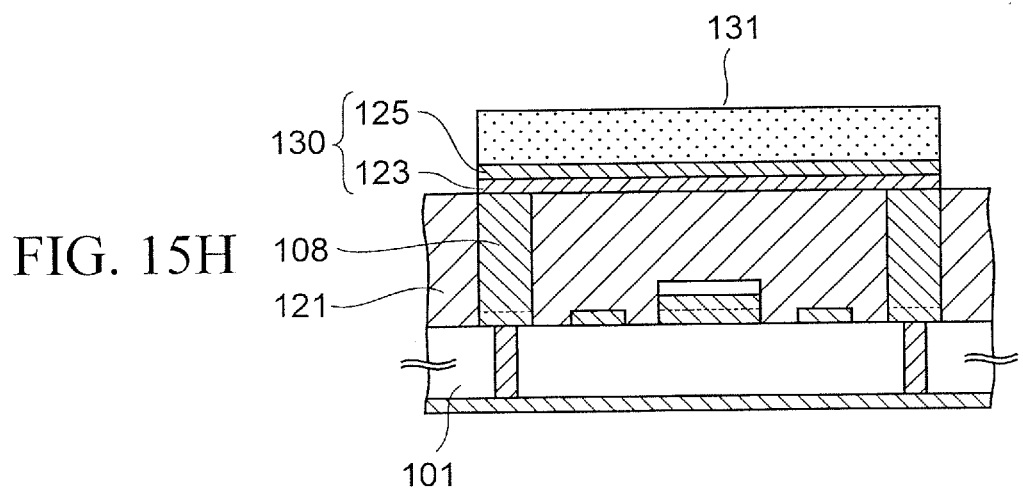

Next, as illustrated in FIG. 15H, a photoresist is applied onto the movable upper electrode 130, which is exposed and developed, so that a third resist pattern 131 with a rectangular planar shape is formed.

Then, while the third resist pattern 131 is used as a mask, the movable upper electrode 130 is patterned by the ion milling using an argon gas, so that the planar shape of the movable upper electrode 130 is shaped into a rectangle.

After that, the third resist pattern 131 is removed.

Note that the shape memory treatment (see FIG. 15G) may be performed after the movable upper electrode 130 is patterned as described above.

Figure 15I:
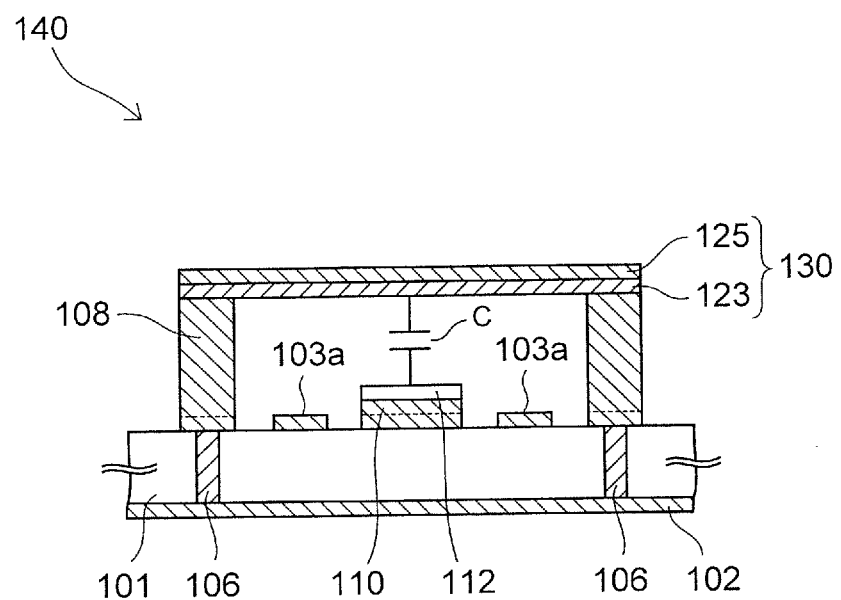

Next, as illustrated in FIG. 15I, a sacrificial film 121 is removed by the wet etching. The sacrificial film 121 using copper as a material thereof may be selectively removed by using any of a ferric chloride solution, a mixed solution of acetic acid and hydrogen peroxide solution, an ammonia copper complex solution and the like as an etching solution.

Then, the sacrificial film 121 is removed as described above, so that the movable upper electrode 130 is released from the restriction of the sacrificial film 121. Thus, the movable upper electrode 130 may be downwardly bent with electrostatic force which is generated from the drive electrode 103a.

Accordingly, the basic structure of the variable capacitor 140 according to the present embodiment may be obtained.

In such a variable capacitor 140, a capacitance C is formed between the line 110 and the movable upper electrode 130, so that the size of the capacitance C to be added to the line 110 is caused to be variable with the downward bending of the movable upper electrode 130. Accordingly, a distribution constant of the line 110 may be changed and electromagnetic wave propagation length of a high-frequency circuit may be changed. Such variable capacitor 140 is preferably applied to a variable filter, for example.

Also, in the present embodiment, a drive electrode 103a is provided in addition to the line 110, and a direct current voltage is applied to the drive electrode 103a to generate electrostatic force for attracting the movable upper electrode 130. Accordingly, there is no state to apply the direct current voltage for generating the electrostatic force to the line 110. Thus, the charge-up of the dielectric film 112 caused due to the direct current voltage may be prevented.

Furthermore, even in a case where the dielectric film 112 is not formed, a risk such that the line 110 and the movable upper electrode 130 come into contact with each other may be reduced by controlling the direct current voltage to be applied to the drive electrode 103a.

Also, in the present embodiment, the lamination film of the nickel film and the titanium film is used as the shape memory alloy film 125. Accordingly, the ratio of the number of atoms of nickel to the number of atoms of titanium in the shape memory alloy film 125 may be easily controlled by controlling the ratio of the film thickness of the nickel film to the film thickness of the titanium film.

Hereinafter, the study carried out by the inventors of the present application in terms of properties of the shape memory alloy film 125 formed as described above is described.

Figure 16A:
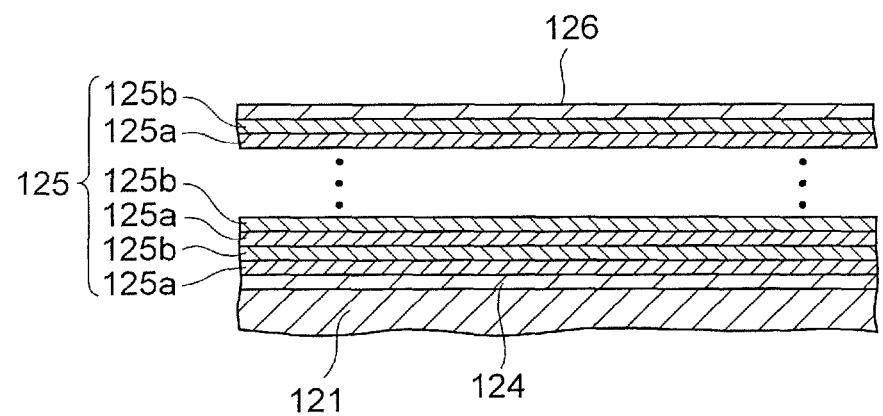
FIGS. 16A and 16B are cross-sectional views schematically illustrating a sample used for a study.
Figure 16B:
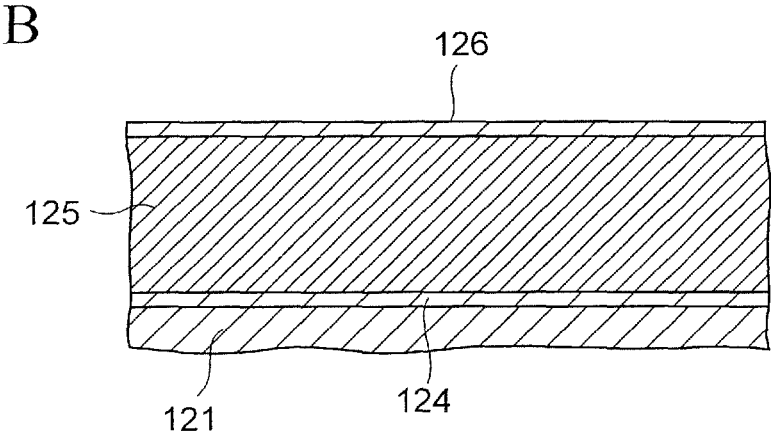

FIGS. 16A and 16B are cross-sectional views, each schematically illustrating a sample used for the study.

As illustrated in FIG. 16A, in this study, a chromium film is formed by the sputtering method as the conductive diffusion prevention film 124 on the sacrificial film 121 using copper as a material thereof.

Then, on the conductive diffusion prevention film 124, the shape memory alloy film 125 is formed by alternately laminating the titanium film 125a with a thickness of 15 nm and the nickel film 125b with a thickness of 10 nm.

In the shape memory alloy film 125, the titanium film 125a and the nickel film 125b are used as one pair, and 120 pairs of the titanium film 125a and the nickel film 125b are laminated. Accordingly, a total thickness of the shape memory alloy film 125 becomes 3 μm, and the ratio of the number of atoms in the shape memory alloy film 125 becomes Ti:Ni=48:52.

Next, as illustrated in FIG. 16B, the shape memory treatment is performed on the shape memory alloy film 125 in a vacuum furnace under conditions with a substrate temperature of 300° C. to 500° C. and a processing time of 30 minutes and 60 minutes. As described above, the shape memory treatment also plays a role as solutionizing treatment with respect to the shape memory alloy film 125, and each of a plurality of titanium films 125a and a plurality of nickel films 125b is caused to be alloy with the shape memory alloy treatment.

Figure 17:
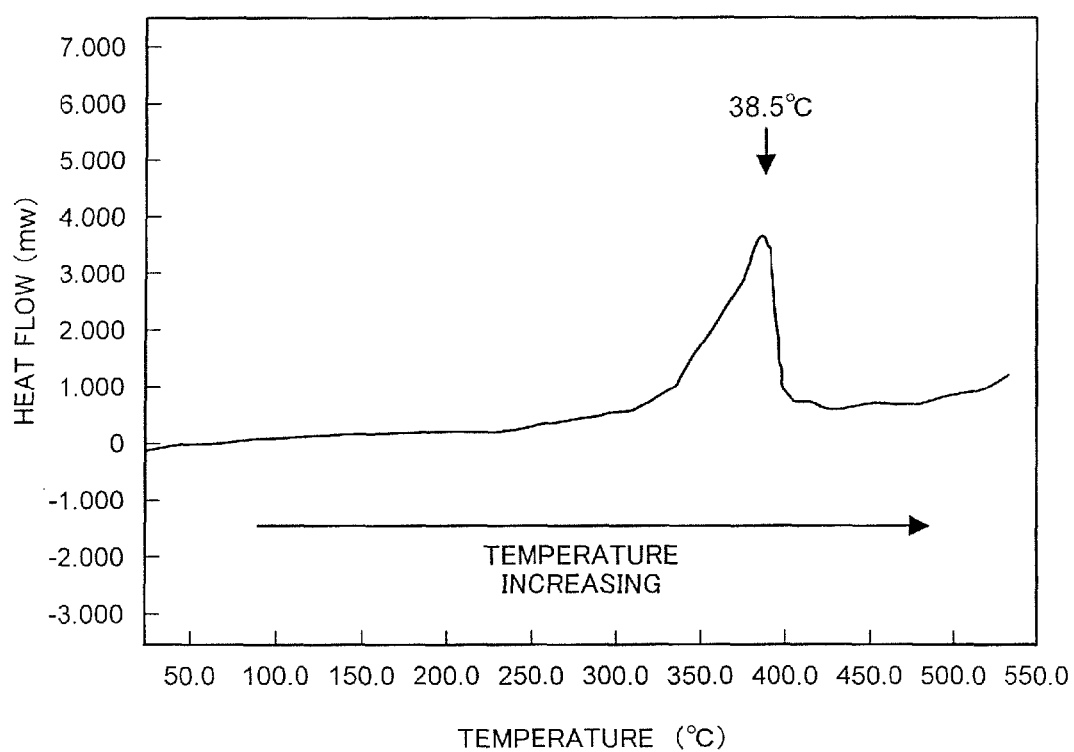
FIG. 17 is a DSC curve (No. 1) of a shape memory alloy film.

FIG. 17 is a graph illustrating a DSC (Differential Scanning Calorimetry) curve of the shape memory alloy film 125 which is obtained by increasing a temperature of the sample after completion, in which the horizontal axis depicts a temperature (° C.) and the vertical axis depicts a heat flow (mW).

As illustrated in FIG. 17, the shape memory alloy film 125 becomes solution at 385° C.

Figure 18:
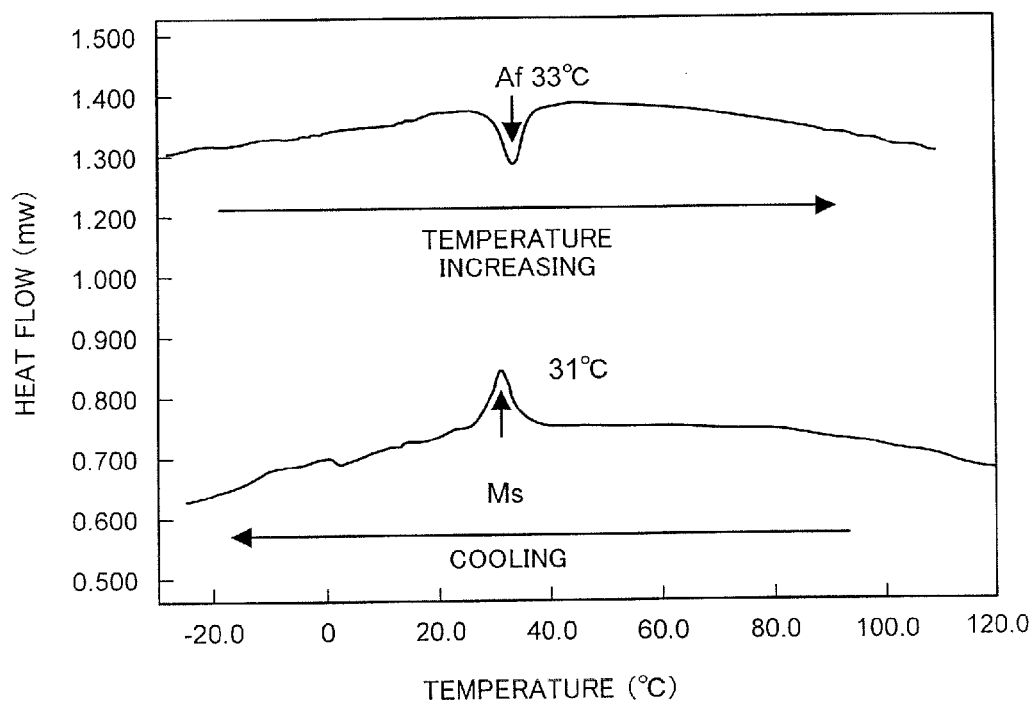
FIG. 18 is a DSC curve (No. 2) of a shape memory alloy film.

Also, FIG. 18 is a graph illustrating another DSC curve of the shape memory alloy film 125.

The DSC curve on the lower side in FIG. 18 is obtained by cooling the shape memory alloy film 125 after the DSC curve in FIG. 17 is obtained. The DSC curve on the upper side in FIG. 18 is obtained by increasing the temperature of the shape memory alloy film 125 again after the cooling.

As illustrated in FIG. 18, it becomes clear that the shape memory alloy film 125 has the transformation temperature of substantially room temperature with the Af point of 33° C. and the Ms point of 31° C.

Next, another study carried out by the inventors of the present application is described.

In the study, an amount of curve of the movable upper electrode 130 along with the change in the ambient temperature is studied. A film thickness of the shape memory alloy film 125 formed as one portion of the movable upper electrode 130 is 2 μm, and the transformation temperature is 47° C.

Also, as a comparative example, a sample in which the shape memory alloy film 125 is not formed and the metal film 123 is used as the movable upper electrode 130 is prepared. In the sample, a gold film with a thickness of 1 μm is formed as the metal film 123. Note that a titanium film with a thickness of 50 nm is formed as an adhesion film on the lower surface of the metal film 123.

Figure 19:
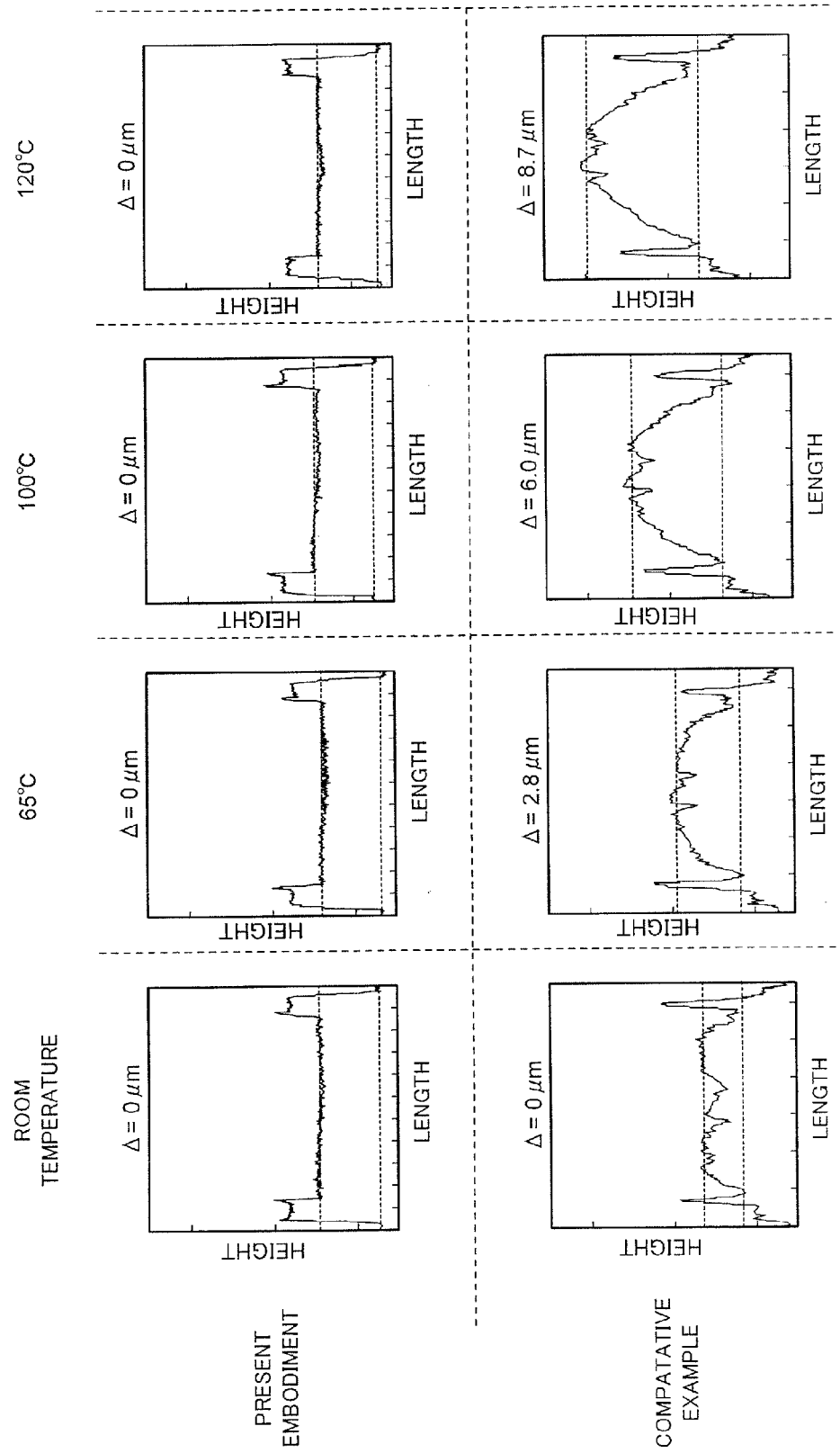
FIG. 19 is graphs illustrating results of studying a curve amount of movable upper electrode along with a change in ambient temperature.

Results of the study are illustrated in FIG. 19.

The horizontal axis of each graph in FIG. 19 illustrates a length (μm) of the movable upper electrode 130, which is measured from the pillar 108 (see, FIG. 15I) in the substrate lateral direction and the vertical axis is a height (μm) of the movable upper electrode 130 which is measured from any reference point in the substrate vertical direction.

Note that, in FIG. 19, in each of the present embodiment and the comparative example, an amount in which the center portion of the movable upper electrode 130 upwardly displaces from the position at the room temperature is expressed by a curve amount Δ.

As illustrated in FIG. 19, in the present embodiment, the curve amount Δ of the movable upper electrode 130 is 0 μm from the room temperature to 120° C.

On the other hand, in the comparative example, the curve amount Δ becomes approximately 9 μm at 120° C.

For this reason, it is confirmed that using the shape memory alloy film 125 for one portion of the movable upper electrode 130 as described in the present embodiment is effective to suppress the curve of the movable upper electrode 130, which is caused by the change in the ambient temperature.

Eighth Embodiment

In the above-described first to seventh embodiments, the movable portion is bent with electrostatic force. On the other hand, in the present embodiment, a movable portion is bent by a piezoelectric element.

Figure 20A:
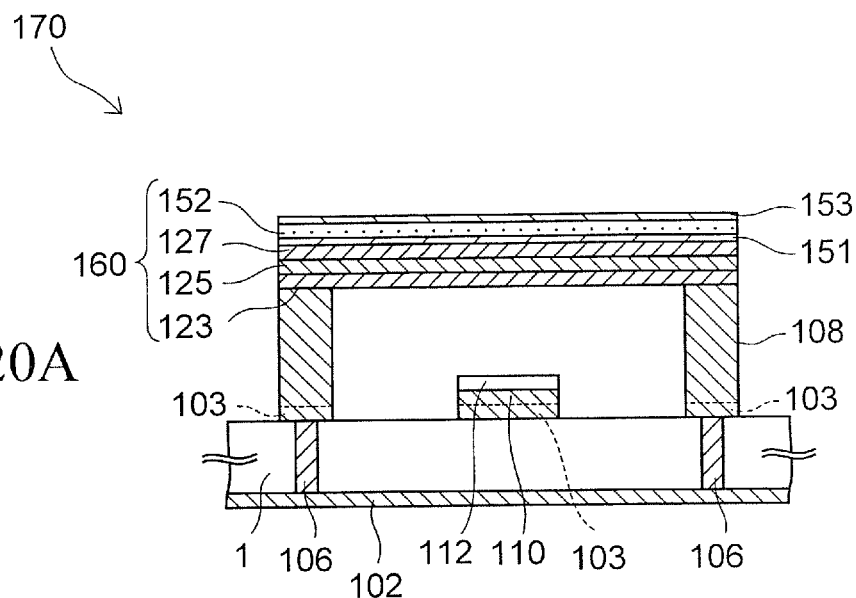
FIGS. 20A and 20B are cross-sectional views of a variable capacitor according to an eighth embodiment.
Figure 20B:
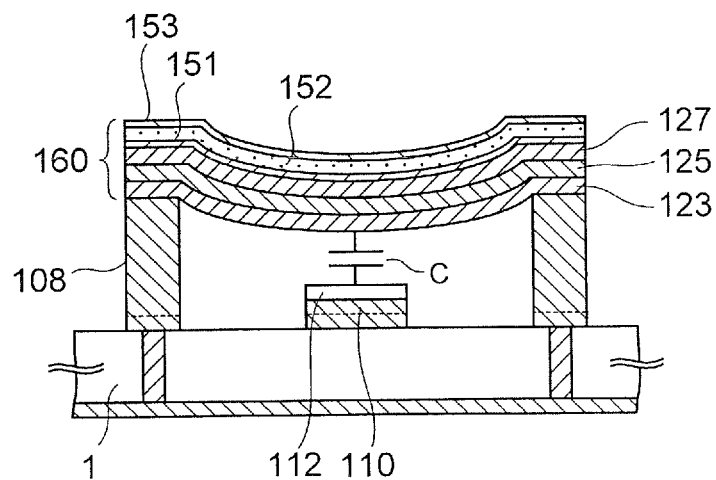

FIGS. 20A and 20B are cross-sectional views of a variable capacitor 170 according to the present embodiment. Note that same reference numerals are given to denote element same as those described in the seventh embodiment, and the description thereof is omitted below.

As illustrated in FIG. 20A, a variable capacitor 170 according to the present embodiment has a movable upper electrode 160.

The movable upper electrode 160 is formed by forming a metal film 123, a shape memory alloy film 125, an upper metal film 127, a first electrode 151, a piezoelectric element 152, and a second electrode 153 in this order.

Among them, as the piezoelectric element 152, for example, a PZT (lead zirconia titanate) film with a thickness of approximately 1 μm to 2 μm may be formed. Also, as a material for the upper metal film 127, a pure metal whose electric resistance is smaller than that of the shape memory alloy film 125, such as gold, aluminum, and copper, is used.

Then, as for both the first electrode 151 and the second electrode 153, a platinum film with a thickness of approximately 300 nm may be formed.

In such a variable capacitor 170, as illustrated in FIG. 20B, a negative voltage is applied to the first electrode 151 and a positive voltage is applied to the second electrode 153, so that the piezoelectric element 152 is bent. Then, the bending of the piezoelectric element 152 causes the bending of the movable upper electrode 160, so that the size of the capacitance C which is formed by the movable upper electrode 160 and the line 110 may be adjusted.

Furthermore, since the movable upper electrode 160 has the shape memory alloy film 125, even when the metal film 123 and the upper metal film 127 tend to be bent by thermal expansion, the shape memory alloy film 125 functions to suppress the bending. Accordingly, the movable upper electrode 160 may be prevented from being bent by a change in the ambient temperature.

As a result, even when the ambient temperature changes, a bending amount of the movable upper electrode 160 may be precisely controlled by a potential difference between the first electrode 151 and the second electrode 153. Thus, a predetermined capacitance C may be obtained without the change in the ambient temperature.

Next, a method of manufacturing the variable capacitor 170 is described.

FIGS. 21A to 21E are cross-sectional views of the variable capacitor in the course of manufacturing thereof according to the present embodiment.

To manufacture the variable capacitor, firstly, the processes of FIG. 15A to FIG. 15G described in the seventh embodiment are performed as processes to obtain the cross-sectional structure illustrated in FIG. 21A.

Note that in the present embodiment, the movable upper electrode 160 is bent by the piezoelectric element 152 as described above. Thus, a drive electrode 130a (see FIG. 15C) for generating electrostatic force is not used.

Furthermore, as illustrated by referring to FIG. 15F, the conductive diffusion prevention film 124 and the conductive oxidation prevention film 126 are respectively formed on the lower surface and upper surface of the shape memory alloy film 125.

Note that the conductive oxidation prevention film 126 also has a function as a diffusion prevention film to prevent constituent atoms of the piezoelectric element 152 (see FIG. 20A) to be formed later from diffusing into the shape memory alloy film 125.

Figure 21C:
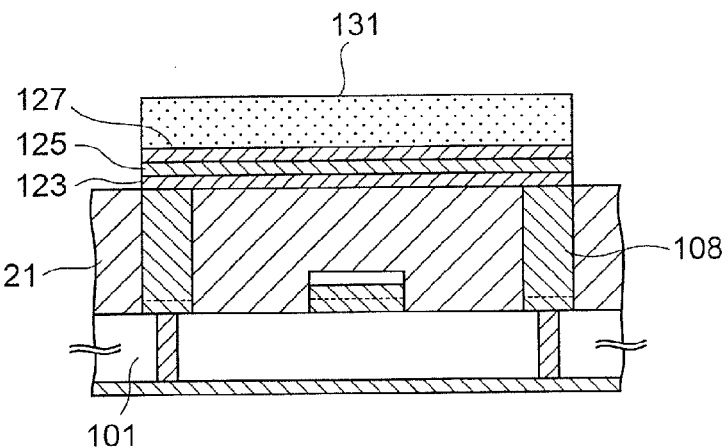

Subsequently, as illustrated in FIG. 21B, a gold film is formed as a second metal film 127 by the sputtering method or the like. Thereafter, as illustrated in FIG. 21C, a third resist pattern 131 is formed on the second metal film 127.

Then, the third resist pattern 131 is used as a mask, and each of the metal film 123, the shape memory alloy film 125, and the upper metal film 127 is patterned by the ion milling.

After that, the third resist pattern 131 is removed.

Figure 21D:
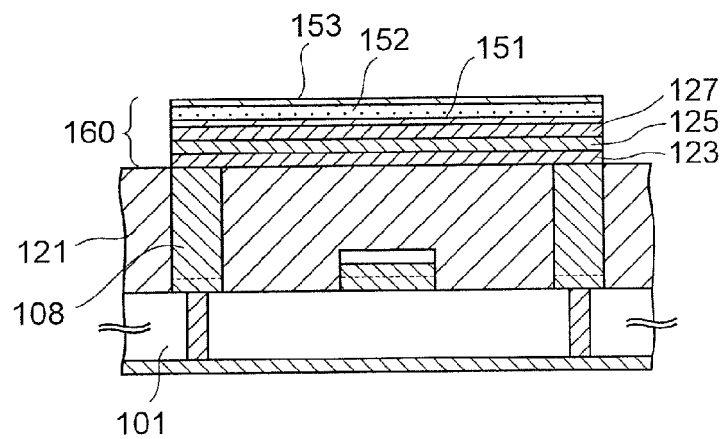

Next, the processes to obtain the cross-sectional structure illustrated in FIG. 21D are described.

Firstly, a platinum film is formed with a thickness of approximately 300 nm as a first electrode 151 on the entire upper surface of the insulating substrate 101 by the sputtering method.

Next, a PZT coating film is formed with a thickness of approximately 1 μm to 2 μm on the first electrode 151 by the sol-gel method. The resultant PZT film is cured by the lamp annealing to form a piezoelectric element 152.

Then, a platinum film is formed with a thickness of approximately 300 nm on the piezoelectric element 152 by the sputtering method. The resultant platinum film is used as a second electrode 153.

After that, the first electrode 151, the piezoelectric element 152, and the second electrode 153 are patterned by the ion milling.

With the processes so far, the movable upper electrode 160 including the shape memory alloy film 125 and the piezoelectric element 152 is formed.

Figure 21E:
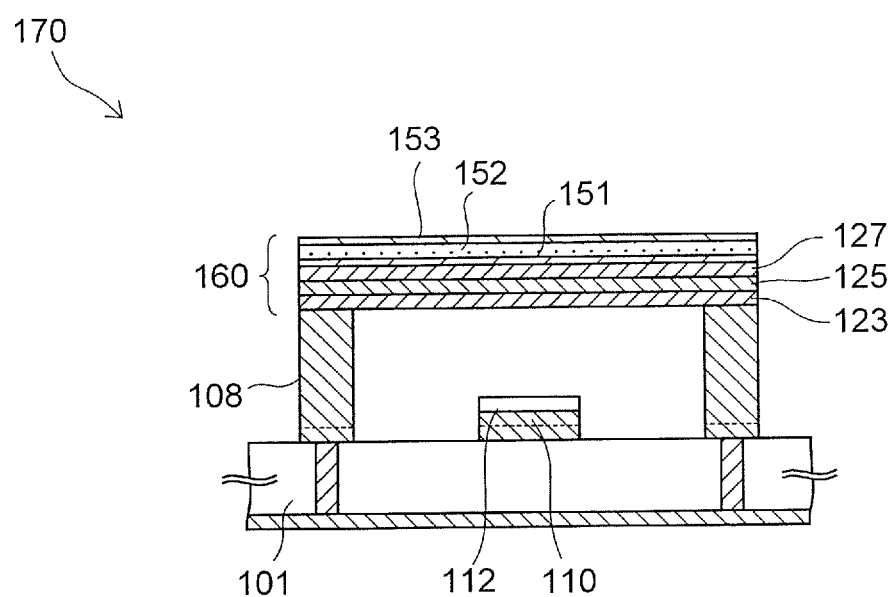

Next, as illustrated in FIG. 21E, the sacrificial film 121 is removed by the wet etching. The sacrificial film 121 using copper as a material thereof may be selectively removed by using any of a ferric chloride solution, a mixed solution of acetic acid and hydrogen peroxide solution, an ammonia copper complex solution and the like as an etching solution.

Then, the sacrificial film 121 is removed as described above, so that the movable upper electrode 160 is released from the restriction of the sacrificial film 121. Thus, the movable upper electrode 160 may be downwardly bent with the piezoelectric element 152.

As described above, the basic structure of the variable capacitor 170 according to the present embodiment is obtained.

Ninth Embodiment

In the above-described eighth embodiment, the variable capacitor including the piezoelectric element 152 and the shape memory alloy film 125 is described.

On the other hand, in the present embodiment, a switch element including a piezoelectric element and a shape memory alloy film is described.

Figure 22A:
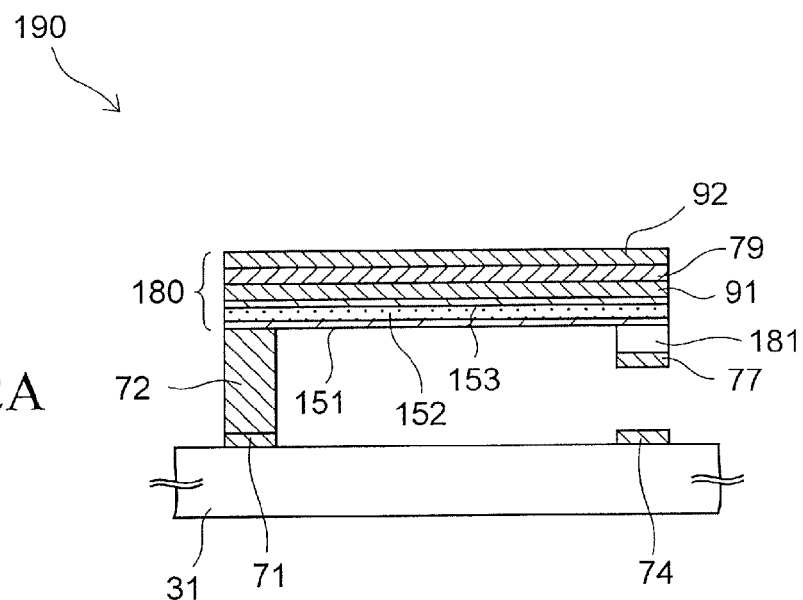
FIGS. 22A and 22B are cross-sectional views of a switch element according to a ninth embodiment.
Figure 22B:
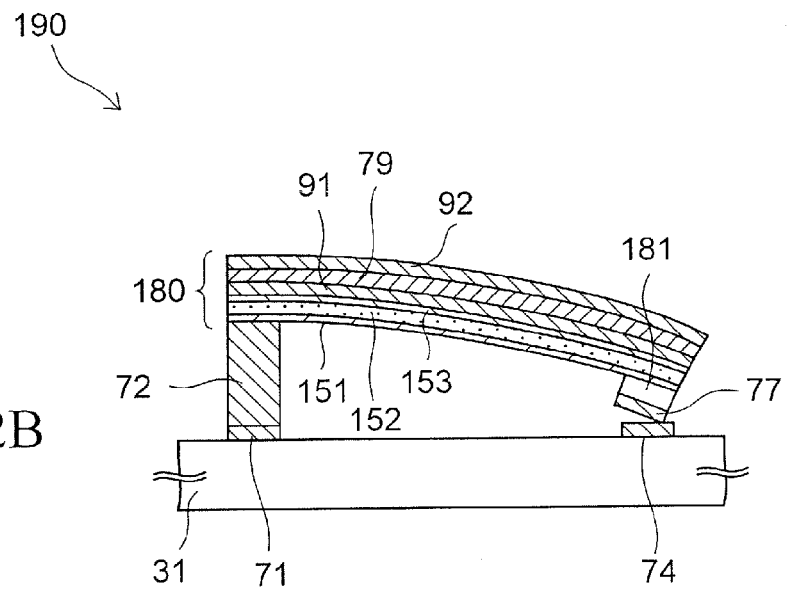

FIGS. 22A and 22B are cross-sectional views of a switch element according to the present embodiment. Note that in FIGS. 22A and 22B, same reference numerals are given to denote elements same as those described in the fifth and sixth embodiments, and the description thereof is omitted below.

As illustrated in FIG. 22A, a switch element 190 according to the present embodiment includes a contact 77, a cantilever 180, and an insulator 181.

Among them, the cantilever 180 is formed by forming a first electrode 151, a piezoelectric element 152, a second electrode 153, a first metal film 91, a shape memory alloy film 79, and a second metal film 92 in this order.

Also, the insulator 181 is provided at the tip end of the cantilever 180, and the contact 77 is provided in the lower surface of the insulator 181.

In such a switch element 190, as illustrated in FIG. 22B, a negative voltage is applied to the first electrode 151 and a positive voltage is applied to the second electrode 153, so that the piezoelectric element 152 is bent. Then, the bending of the piezoelectric element 152 bends the cantilever 180 to the insulating substrate 31 side, so that the first conductive pattern 74 comes into contact with the contact 77. Accordingly, the switch element 190 is turned on.

Furthermore, since the cantilever 180 has the shape memory alloy film 79, even when the first and second metal films 91, 92 tend to bend in a direction away from the insulating substrate 31 with thermal expansion, the shape memory alloy film 79 functions to suppress the bending.

As a result, even when the ambient temperature changes, a bending amount of the cantilever 180 may be controlled by a potential difference between the first electrode 151 and the second electrode 153. Thus, the contact 77 and the first conductive pattern 74 may be caused to come into contact with each other regardless of the change in the ambient temperature.

Hereinafter, a method of manufacturing the switch element 190 is described.

FIGS. 23A to 23F are cross sectional views of the switch element according to the present embodiment.

Figure 23A:
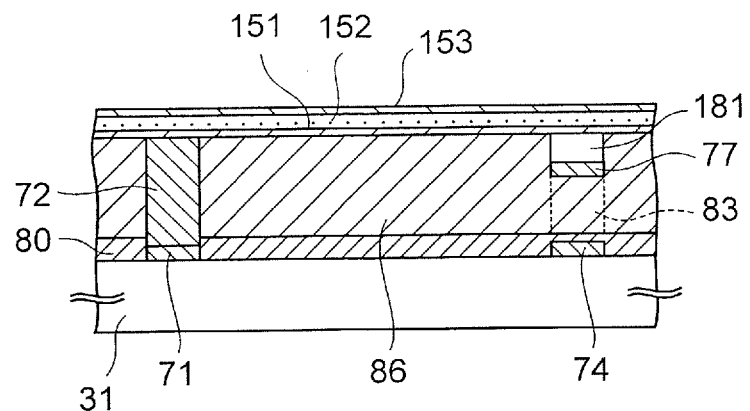
FIGS. 23A to 23F are cross-sectional views of the switch element in the course of manufacturing thereof according to the ninth embodiment.

Firstly, the processes to obtain the cross-sectional structure illustrated in FIG. 23A are described.

Firstly, the processes of FIGS. 11A to 11D described in the fourth embodiment are performed to embed the surroundings of the pillar 72 and the contact 77 with the second sacrificial film 86.

Note that in the present embodiment, a silicon oxide film is selectively formed as an insulator 181 on the contact 77 by the sputtering method before the second sacrificial film 86 is formed.

Next, a platinum film is formed as the first electrode 151 on each of the pillar 72, the second sacrificial film 86, and the insulator 181 with a thickness of approximately 300 nm by the sputtering method.

Next, a PZT film is formed with a thickness of approximately 1 μm to 2 μm on the first electrode 151 by the sol-gel method. The resultant PZT film is cured by the lamp annealing to form the piezoelectric element 152.

Furthermore, a platinum film is formed with a thickness of approximately 300 nm on the piezoelectric element 152 by the sputtering method. The resultant platinum film is used as a second electrode 153.

Figure 23B:
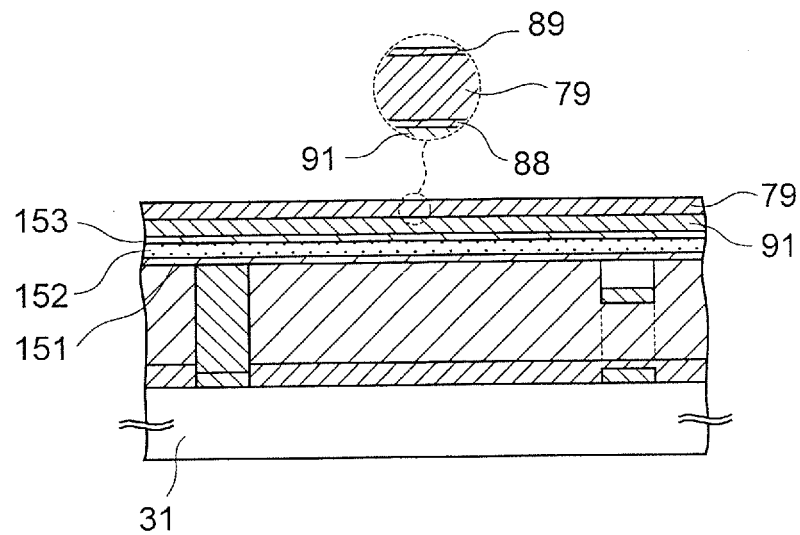

Subsequently, as illustrated in FIG. 23B, a gold film is formed as the first metal film 91 with a thickness of approximately 1 μm to 2 μm on the second electrode 153 by the sputtering method. Note that an aluminum film or a copper film may be formed in place of the gold film, or a lamination film thereof may be formed.

Then, a chromium film is formed with a thickness of approximately 300 nm to 500 nm on the first metal film 91. The resultant chromium film is used as a conductive diffusion prevention film 88.

Furthermore, a sputter target made of a TiNi alloy is used and an argon gas is used as a sputtering gas, and a TiNi film is formed as the shape memory alloy film 79 with a thickness of approximately 2 μm to 3 μm on the conductive diffusion prevention film 88 by the sputtering method.

In the shape memory alloy film 79, a ratio of the number of atoms of Ti to the number of atoms of Ni in the film is adjusted, so that the transformation temperature $T_{th}$ is set to be equal to or lower than about a room temperature. For example, −20° C. is assumed.

Next, a chromium film is formed as a conductive oxidation prevention film 89 with a thickness of approximately 300 nm to 500 nm on the shape memory alloy film 79 by the sputtering method.

Figure 23C:
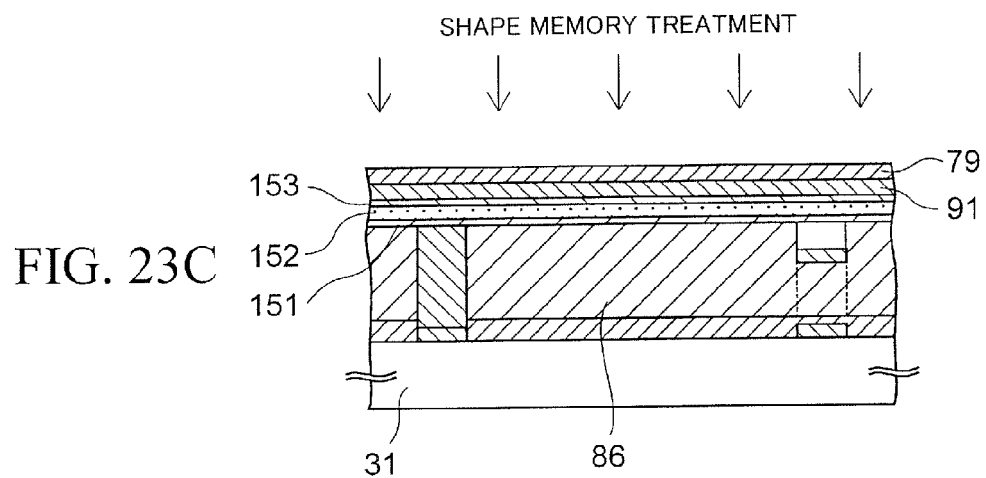

Next, as illustrated in FIG. 23C, shape memory treatment is performed on the shape memory alloy film 79 in the atmosphere of the inert gas such as argon or in vacuum to cause the shape memory alloy film 79 to memorize a flat shape.

The conditions for the shape memory treatment are not particularly limited. For example, a substrate temperature of 350° C. to 500° C. and a processing time of 30 minutes to 60 minutes are employed as the conditions.

Figure 23D:
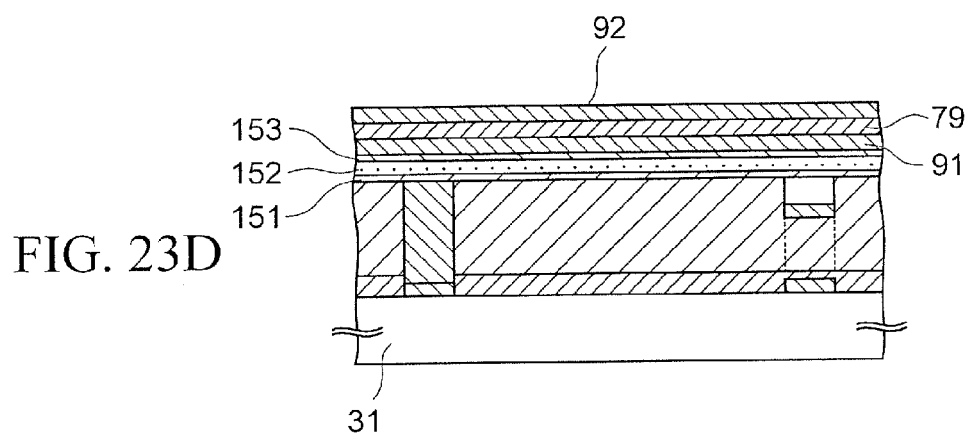

Subsequently, as illustrated in FIG. 23D, a gold film is formed as a second metal film 92 on the shape memory alloy film 79.

Figure 23E:
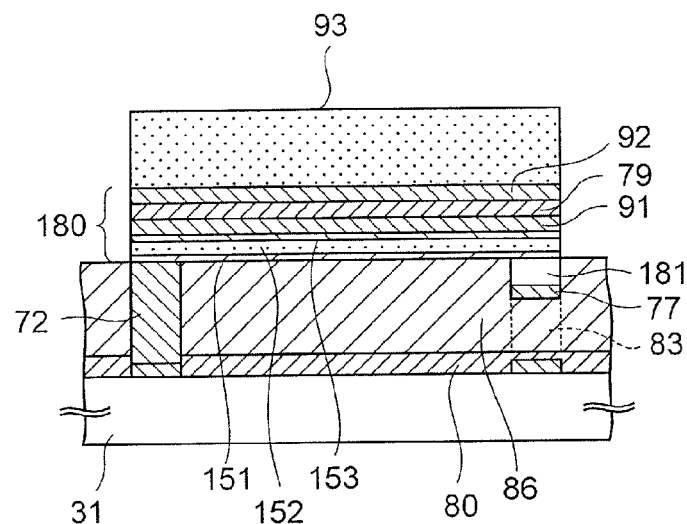

Next, as illustrated in FIG. 23E, a first resist pattern 93 is formed on the second metal film 92. Then, while the first resist pattern 93 is used as a mask, the films from the second metal film 92 to the first electrode 151 are patterned by the ion milling using an argon gas, so that the cantilever 180 is formed.

After that, the first resist pattern 93 is removed.

Figure 23F:
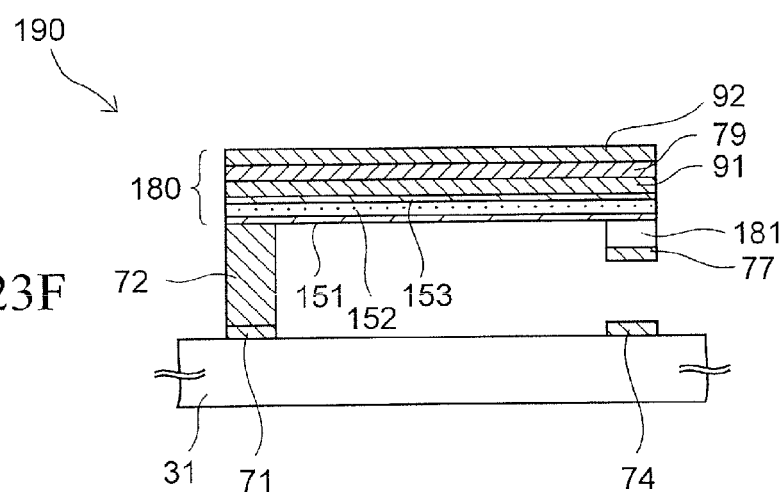

Thereafter, as illustrated in FIG. 23F, the seed layer 80 and the first and second sacrificial films 83, 86 are removed by the wet etching. When the first and second sacrificial films 83, 86 are copper films, as an etching solution capable of being used in the present process, any of a ferric chloride solution, a mixed solution of acetic acid and hydrogen peroxide solution, an ammonia copper complex solution and the like is available.

Also, the present process may be performed by RIE in place of the wet etching.

The first and second sacrificial films 83, 86 are removed as described above, so that the cantilever 180 is released from the restriction of the first and second sacrificial films 83, 86. Thus, the cantilever 180 may be downwardly bent with the piezoelectric element 152.

Accordingly, the basic structure of the switch element 190 according to the present embodiment is completed.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device comprising:
   a substrate;
   a first electrode formed on the substrate; and
   a movable portion provided above the first electrode, the movable portion being elastically deformable,
   wherein the movable portion includes a shape memory alloy film, a diffusion prevention film and an oxidation prevention film, and
   the shape memory alloy film is held between the diffusion prevention film and the oxidation prevention film.

2. The electronic device according to claim 1, wherein the movable portion includes a second electrode and the movable portion is bent with electrostatic force generated between the first electrode and the second electrode.

3. The electronic device according to claim 1, wherein
   the movable portion includes a piezoelectric element held between a third electrode and a fourth electrode, and
   bending of the piezoelectric element bends the movable portion.

4. The electronic device according to claim 1, wherein at least one of the diffusion prevention film and the oxidation prevention film contains chromium.

5. The electronic device according to claim 1, wherein at least one of the diffusion prevention film and the oxidation prevention film contains platinum.

6. The electronic device according to claim 2, wherein the shape memory alloy film is a lamination film of a titanium film and a nickel film or a film obtained by subjecting a lamination film of a titanium film and a nickel film to heat treatment.

7. The electronic device according to claim 2, wherein
   one portion of the movable portion is mechanically connected with the substrate, and
   the shape memory alloy film is formed to extend from the one portion partway toward a portion above the electrode.

8. The electronic device according to claim 2, wherein the movable portion is a lamination film including the shape memory alloy film and a metal film.

9. The electronic device according to claim 8, wherein the metal film is formed in one of a lowermost layer and an uppermost layer of the lamination film or in both of the lowermost layer and the uppermost layer.

10. The electronic device according to claim 1, wherein a transformation temperature of the shape memory alloy film is lower than 50° C.

11. The electronic device according to claim 2, wherein the movable portion is formed by forming a first metal film, the shape memory alloy film, and a second metal film in this order.

12. The electronic device according to claim 1, wherein
    the first electrode is a lower electrode of a capacitor,
    among electrodes formed on the movable portion side, an electrode closest to the first electrode is an upper electrode of the capacitor, and
    the bending of the movable portion causes a capacitance of the capacitor to be variable.

13. The electronic device according to claim 1, further comprising:
    a line formed on the substrate at a distance from the first electrode,
    wherein the bending of the movable portion causes a capacitance between the line and the closest electrode to be variable.

14. The electronic device according to claim 1, further comprising:
    a first conductive pattern formed on the substrate; and
    a second conductive pattern formed on the substrate at a distance from the first conductive pattern,
    wherein the movable portion is bent to come into contact with each of the first conductive pattern and the second conductive pattern, so that the first conductive pattern and the second conductive pattern are electrically connected with each other through the movable portion.

* * * * *